United States Patent [19]

Iwata et al.

[11] Patent Number: 5,880,500

[45] Date of Patent: Mar. 9, 1999

[54] SEMICONDUCTOR DEVICE AND PROCESS AND APPARATUS OF FABRICATING THE SAME

[75] Inventors: Hiroshi Iwata, Ikoma-gun; Masayuki Nakano, Tenri; Seizo Kakimoto, Shiki-gun, all of Japan

[73] Assignee: Sharp Kabushiki Kaisha, Osaka, Japan

[21] Appl. No.: 675,595

[22] Filed: Jul. 3, 1996

[30] Foreign Application Priority Data

Jul. 5, 1995 [JP] Japan ................................ 7-169658

[51] Int. Cl.[6] .......................... H01L 29/76; H01L 29/94; H01L 31/062
[52] U.S. Cl. ............................ 257/336; 257/344; 257/382
[58] Field of Search .................... 257/335, 336, 257/344, 382, 383, 384, 408

[56] References Cited

U.S. PATENT DOCUMENTS 4,949,136  8/1990  Jain ........................................ 257/344
5,091,763  2/1992  Sanchez ................................ 257/344

OTHER PUBLICATIONS

Tsukamoto et al., "Self–aligned titanium silicidation by lamp annealing" *Extended Abstracts of the 16th (1984 International) Conference on Solid State Devices and Materials*, Kobe, 1984, pp. 47–50.

Moy et al., "Use of thin titanium salicides for submicron VLSI CMOS" *Proc. 1st Int. Symp. ULSI Science and Technology*, Philadelphia, 1987 (Electrochemical Society, Pennington, 1987), pp. 381–392.

Ogawa et al., "Dependence of thermal stability of the titanium silicide/silicon structure on impurities" *Appl. Phys. Lett.* (1990) 56(8):725–727.

Georgiou et al., "Thermal stability limits of thin $TiSi_2$. Effect on submicron line resistance and shallow junction leakage" *J. Electrochem. Soc.* (1994) 141(5):1351–1356.

Lasky et al., "Comparison of transformation to low–resistivity phase and agglomeration of $TiSi_2$ and $CoSi_2$" *IEEE Transactions on Electron Devices* (1991) 38(2):262–268.

*Primary Examiner*—Wael Fahmy
*Attorney, Agent, or Firm*—Morrison & Foerster LLP

[57] ABSTRACT

A semiconductor device having a gate electrode on a Si-substrate through a gate oxide film; a first impurity diffusion region having a conductivity type reversed to a well which will form a part of source and drain regions in the two opposing sides of the gate electrode through gate electrode sidewall dielectric films; a second impurity diffusion region having the same conductivity type as the first impurity diffusion region beneath the gate electrode sidewall dielectric film, touching a channel region directly below the gate electrode and being shallower than the first impurity diffusion region; a titanium silicide film on the gate electrode and the surface of the Si-substrate of the first impurity diffusion region in the two opposing sides of the gate electrode sidewall dielectric film; and a third impurity diffusion region, formed in the first impurity diffusion region, having a higher concentration than the first impurity diffusion region and the same conductivity type as the first and second impurity diffusion region. The above semiconductor device is able to suppress the short-channel effects, and reduce the source-drain parasitic resistance and the source-drain junction leakage current while maintaining a small source-drain capacity.

10 Claims, 7 Drawing Sheets

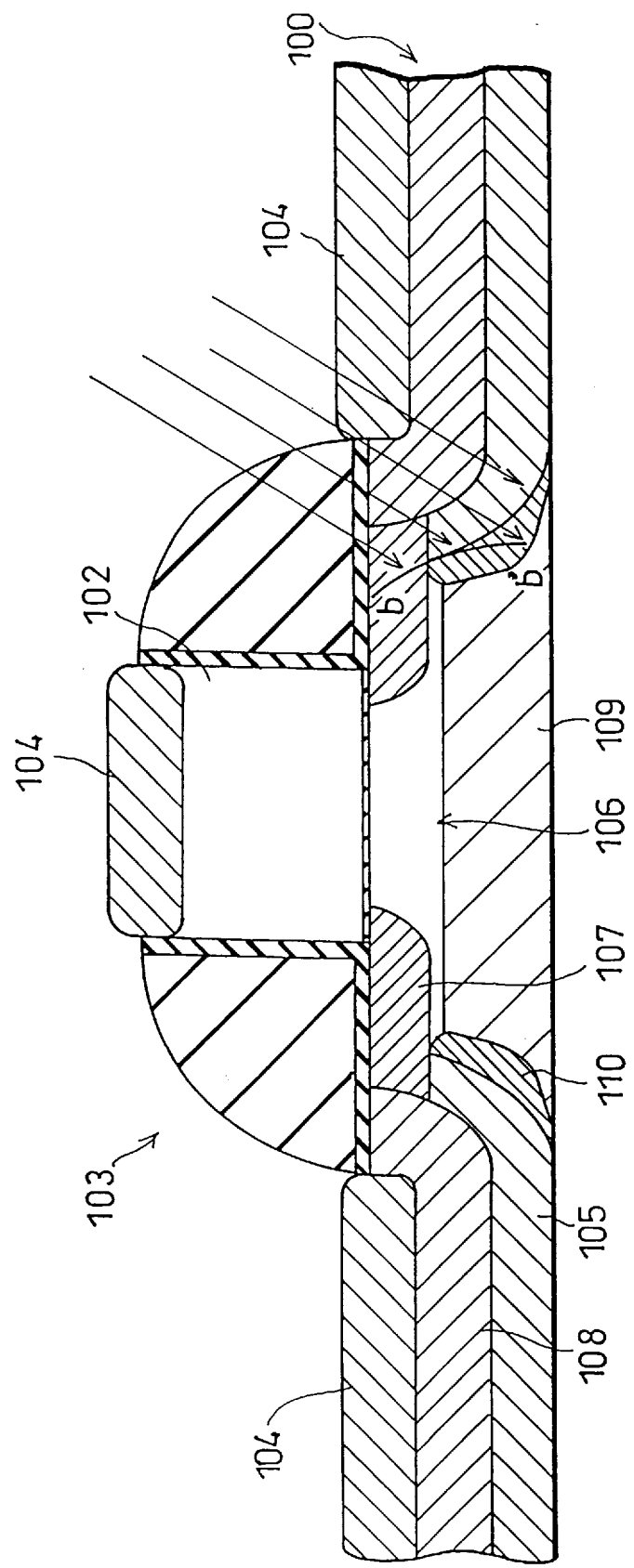

FIG. 4 (a)
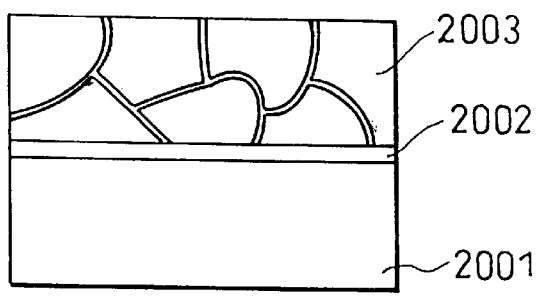
FIG. 4 (b)
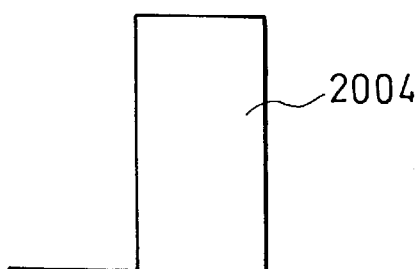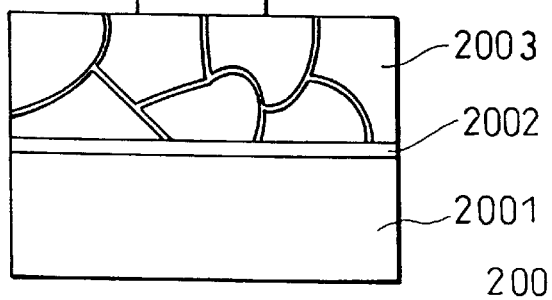
FIG. 4 (c)
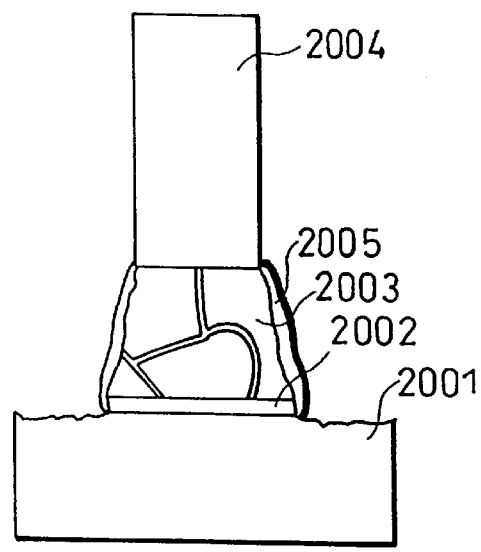
FIG. 4 (d)
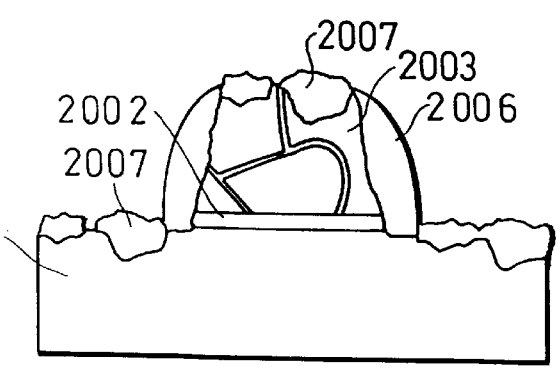

SEMICONDUCTOR DEVICE AND PROCESS AND APPARATUS OF FABRICATING THE SAME

FIELD OF THE INVENTION

The present invention relates to a semiconductor device and a process of fabricating the same, and more particularly, to a process of fabricating a titanium silicide film of low resistance with excellent heat resistance and a process of fabricating a salicide transistor capable of reducing the junction leakage and suppressing the short-channel effects.

BACKGROUND OF THE INVENTION

An example conventional fabricating process using a self-aligned silicidation technique (salicide transistor technique) is shown in FIGS. 7(a) through 7(e), which is disclosed in a report of K. Tsukamoto, T. Okamoto, M. Shimizu, T. Matsukawa, and H. Harada, page 47 of "Extended Abstracts 16th (1984 International) Conference on Solid State Devices and Materials, Kobe, 1984", Business Center for Academic Societies Japan, Tokyo, 1984.

As shown in FIG. 7(a), a field oxide film 402, a gate oxide film 403, and a gate electrode 404 made of polysilicon whose sidewalls are covered with dielectric films 405 are formed on a silicon semiconductor substrate (hereinafter, referred to as Si-substrate) 401. Note that phosphorous is diffused into the polysilicon before patterning the gate electrode to dope an impurity into the gate electrode 404.

Next, as shown in FIG. 7(b), after an oxide film 406 is deposited, high-concentrated impurity ions are doped into the Si-substrate 401 where source and drain regions 407 will be made through the oxide film 406 using a photoresist mask. The impurity ions referred herein are, for example, arsenic ions in case of an n-channel and boron ions in case of a p-channel. Then, the Si-substrate 401 is subject to thermal annealing, for example, at 900° C. for 30 minutes in nitrogen atmosphere to activate the impurity ions. As a result, the source and drain regions 407 are made in the Si-substrate 401.

Next, as shown in FIG. 7(c), after the oxide film 406 is removed from the source and drain regions 407 and gate electrode 404 with a solution or the like containing hydrofluoric acid, a titanium film 408 is sputter-deposited in argon atmosphere.

Next, as shown in FIG. 7(d), the Si-substrate 401 is subject to a first RTA (Rapid Thermal Annealing) at 675° C. for about 20 seconds in nitrogen atmosphere to let silicon of the source and drain regions 407 and gate electrode 404 react with titanium. As a result, a titanium silicide film 410 having a metastable stoichiometric TiSi$_2$ C49 crystal structure is formed. At this point, the surface of the titanium film 408 turns into a titanium nitride film 409.

Next, as shown in FIG. 7(e), after an unreacted portion of the titanium film 408 and the titanium nitride film 409 resulted from the first RTA are selectively etched off with a mixed solution of sulfuric acid and aqueous hydrogen peroxide, the Si-substrate 401 is subject to a second RTA at 800° C. for about 20 seconds in nitrogen atmosphere to let the titanium silicide film 410 transform to a titanium silicide film having a stable stoichiometric TiSi$_2$ C54 crystal structure.

However, oxygen or impurities interfere with the silicidation reaction in the above conventional semiconductor device fabricating process, and the resulting semiconductor device has problems, such as an increase in the junction leakage current and being more vulnerable to the short-channel effects.

To be more specific, when a CMOS device is fabricated by the conventional fabricating process, the Si-substrate is masked by a photoresist to dope the donor and the acceptor into their respective desired regions. Therefore, the oxide film 406 is a must in preventing contamination of the Si-substrate 401 by the physical contact to the photoresist containing a great amount of heavy metal during the ion implantation. This is the reason why the impurity ion implantation is carried out through the oxide film 406 in the conventional fabricating process. However, the knock-on oxygen inevitably caused by the impurity ion implantation always accelerates the penetration of oxygen into silicon. The adverse effect of such knocked-on oxygen is obvious especially when heavy ions are doped. Also, the knocked-on oxygen serves as the center of the deeper level recombination, and it undesirably increases the junction leakage current. These problems become more serious in the silicidation, which will be described below.

Additionally, during the wet step (cleaning followed by resist coating) for the patterning in the convectional gate electrode fabricating process, the polysilicon film, which will be made into the gate electrode, is deposited and open to air. Then, the wafer is transported for the following step while the surface of the polysilicon film is open to air. Thus, oxygen penetrates far deep into the polysilicon film along the crystal grain boundary from the surface. Once oxygen has penetrated into the polysilicon film, it can not be removed by, for example, the cleaning treatment (hydrofluoric acid treatment) before the silicidation.

Therefore, the adverse effect of such oxygen can not be eliminated in the silicidation reaction, and the 4-element (titanium-silicon-impurity-oxygen) silicidation reaction takes place. In this case, the impurity and oxygen interfere with the silicidation reaction, and oxides, such as SiO$_2$, are produced predominately around the grain boundary of TiSi$_2$. This increases the sheet resistivity and deteriorates the heat resistance.

Deterioration of the heat resistance, in particular, accelerates the agglomeration of the TiSi$_2$ film during the post-silicidation thermal annealing, and there occurs a further problem if a film of a line narrower than the grain size of TiSi$_2$ is subject to silicidation. Incidentally, recrystalization of metal usually becomes most apparent at a 0.6-time melting point (Tm) in absolute temperature. In case of TiSi$_2$, for example, the melting point (Tm) is 1540° C. and 0.6 Tm yields 815° C. Thus, when a thermal annealing is carried out at 800° C. or higher in the inter-layer reflowing step, or the silicidation is carried out through a rapid thermal annealing (RTA) at 900° C. or higher, the TiSi$_2$ film containing SiO$_2$ and hence rendering poor heat resistance agglomerates SiO$_2$ along the grain boundary due to the surface free energy of TiSi$_2$. The TiSi$_2$ film agglomerating SiO$_2$ is disconnected in some portions, and is no longer able to serve as a silicidated line of low resistance. Particularly, when a gate electrode of a line narrower than the grain size of TiSi$_2$ is subject to silicidation, the agglomeration occurs more readily compared with a gate electrode of a wider line, and the agglomerated SiO$_2$ is highly likely to disconnect the line thoroughly. Therefore, the sheet resistivity increases up to substantially the same level as a non-silicidated line. Further, since Ti atoms diffuse through silicon during the agglomeration, the junction leakage current increases in the source and drain regions due to the damages to the junction and the gate oxide film of the gate electrode becomes less reliable. The agglomeration can be inhibited by lowering the temperature of the RTA during silicidation, for example, to 900° C. or lower; however, in this case, it becomes difficult to turn the crystal structure of $TiSi_2$ from C49 to C54, thereby raising the sheet resistivity of the titanium silicide film drastically. Thus, it is difficult to form a satisfactory titanium silicide film through the 4-element silicidation reaction, particularly in case of a narrower line. Although, the line width of a typical gate electrode is reduced to 0.25 μm, there has been an increasing need for a gate electrode of a narrower line. Thus, problems as to keeping the heat resistance high (preventing agglomeration) and resistance low must be solved to fabricate a gate electrode of a narrower line.

As previously mentioned, the source and drain regions are formed by the ion implantation through the oxide film, and for this reason, the knocked-on oxygen serves as the center of the deeper-level recombination and undesirably increases the junction leakage current. Moreover, the silicidation causes a further rise in the junction leakage current.

In addition, as is disclosed in page 381, Proc. 1st Int. Symp. ULSI Science and Technology, Philadelphia, 1987, D. Moy, S. Basavaiah, H. Protschka, L. K. Wang, F. D'Heurle, J. Wetzel, S. Brodsky, and R. Volant, Electrochemical Society, Pennington, 1987, it is known that silicidating an n-type semiconductor (silicon doped with arsenic through the ion implantation) is quite difficult compared with a p-type semiconductor (silicon doped with boron through the ion implantation).

To be more specific, compared with the p-type semiconductor, the silicidation reaction in the n-type semiconductor is interfered with and hence the sheet resistivity increases while the heat resistance deteriorates (the silicide film agglomerates during the high thermal annealing). It remains unclear why there is such a difference in silicidation between the n-type semiconductor and p-type semiconductor, and using different ion seeds is assumed to be a major reason.

Further, in the conventional CMOS fabricating process, both the n-channel and p-channel are annealed simultaneously to activate the impurities doped therein. Thus, if the annealing conditions are optimized to reduce the junction leakage current in the n-channel side, the source-drain junction in the other p-channel side deepens because boron has a larger diffusing coefficient through silicon than that of arsenic. As a result, the short-channel effects become apparent in the p-channel side. Whereas if the annealing conditions are optimized to reduce the junction leakage current in the p-channel side, the crystalline quality will not be fully recovered in the other n-channel side because arsenic ions, which are heavier than boron ions, cause considerable damage during the ion implantation. As a result, the junction leakage current increases in the n-channel side.

The conventional semiconductor device has the above-explained problems and a semiconductor device capable of eliminating all of these problems has not been proposed yet.

SUMMARY OF THE INVENTION

It is therefore a first object of the present invention to provide a semiconductor device capable of suppressing the short-channel effects and decreasing the junction leakage current, and process and apparatus of fabricating the same. Also, it is a second object of the present invention to provide a process of fabricating a CMOS device having a p-type semiconductor device capable of suppressing the short-channel effects and an n-type semiconductor device capable of reducing the junction leakage current.

To fulfill the first object, a semiconductor device of the present invention has a polysilicon gate electrode formed on a silicon semiconductor substrate (Si-substrate) through a gate oxide film, a sidewall dielectric film formed on the sidewall of the gate electrode, a high-melting-point metal silicide film formed on the gate electrode and the surface of the Si-substrate in the two opposing sides of the gate electrode sidewall dielectric film, a channel region formed on the surface of the Si-substrate beneath the gate electrode, and a source region and a drain region formed on the Si-substrate in the two opposing sides of the gate electrode so as to sandwich the channel region. Each of the source and drain regions has first, second, and third impurity diffusion regions. The first impurity region is offset to the channel region, and the second impurity diffusion region touches the channel region and is shallower than the first impurity diffusion region. The third impurity diffusion region is formed in the first impurity diffusion region and shallower than the first impurity diffusion region, and has a higher impurity concentration than the first and second impurity diffusion regions.

According to this arrangement, the first impurity region is made deep to secure a sufficient distance from the interface of the high-melting-point metal silicide film and silicon to the junction, thereby making it possible to reduce the source-drain junction leakage current. Also, since the first impurity diffusion region has a low impurity concentration, the depletion layer can extend so well that the source-drain junction capacitance is reduced. On the other hand, since the second impurity diffusion layer is made shallow, the short-channel effects of the transistor can be suppressed. Further, the high-concentrated third impurity diffusion region is formed in the first impurity diffusion region. This arrangement makes it possible to reduce contact resistance between the first impurity diffusion region and high-melting-point metal silicide film and the parasitic resistance around the source and drain. As a consequence, it has become possible to provide a semiconductor device capable of suppressing the short-channel effects and reducing the junction leakage current.

A fabricating process of the above semiconductor device is arranged in the following manner:

the second impurity that will form the second impurity diffusion region is introduced into the Si-substrate before the gate electrode sidewall dielectric film is formed;

the first impurity that will form the first impurity diffusion region is introduced into the Si-substrate after the gate electrode sidewall dielectric film is formed; and the third impurity that will form the third impurity diffusion region is introduced into the Si-substrate after the high-melting-point silicide film is formed.

This fabrication sequence arrangement makes it possible to reduce the concentration of the impurities interfering with the silicidation reaction to the lowest level before the reaction takes place. Thus, the resulting silicide film renders low resistance and excellent heat resistance. In addition, since the third impurity is introduced after the silicidation reaction, the high-concentrated third impurity diffusion region can be formed without interfering with the silicidation reaction. Accordingly, it has become possible to achieve low resistance connection between the high-melting-point metal silicide film and second impurity diffusion region, and lower the source-drain parasitic resistance in the transistor. Further, in case of a p-channel transistor, boron, if an acceptor impurity introduced through the ion implantation, reacts with the high-melting-point metal during the silicidation reaction, the high-melting-point silicide film and each impurity diffusion region can no longer maintain constant ohmic contact. Thus, although the silicide film renders low resistance, there occurs a surge in the transistor parasitic serial resistance. However, the present invention eliminates this problem by introducing the third impurity after the silicidation reaction.

It is preferable to dope the first and second impurities that will respectively form the first and second impurity diffusion regions into the Si-substrate by the ion implantation through a silicon nitride film deposited on the surface of the Si-substrate without the presence of a natural oxide film. According to this arrangement, "N" (nitrogen atoms) penetrate into the gate polysilicon film and Si-substrate during the ion implantation instead of "O" (oxygen atoms) which penetrate into the same when the impurity ions are doped through an oxide film in the conventional manner. Thus, the migration at the heating, and hence the agglomeration is curbed, thereby rendering excellent heat resistance to the resulting high-melting-point metal silicide film.

Incidentally, an impurity introduced into the n-type semiconductor, such as arsenic, has a larger mass number than an impurity introduced into the p-type semiconductor, such as boron. Thus, when the former is doped by the ion implantation through the oxide film, there is produced a great amount of knock-on oxygen that interferes with the silicidation reaction. Besides, arsenic per se imposes adverse effects on the silicidation reaction. For this reason, the silicidation reaction in the n-type semiconductor is readily interfered with compared with the p-type semiconductor. However, since the fabricating process of the present invention does not include any step where oxygen is knocked on, p-type and n-type silicide films can be formed in the same thickness.

Further, since nitrogen atoms restore the crystalline defect in the Si-substrate caused by the impurity ion implantation, the junction leakage current caused by the crystalline defect can be reduced. To be more precise, the high-melting-point metal diffuses into the Si-substrate during the silicidation reaction, but when there is crystalline defect in the Si-substrate, the high-melting-point metal is trapped into the crystalline defect to serve as a leakage center. To eliminate this problem, it is arranged that the nitrogen atoms restore the crystalline defect in the fabricating process of the present invention, so that no diffusing high-melting-point metal is trapped. Thus, the fabricating process of the present invention is more effective in reducing the leakage current when the junction is made through silicidation reaction.

Further, it is preferable to activate the first and second impurities that will respectively form the first and second impurity diffusion regions before the high-melting-point metal silicide film is formed. According to this fabrication sequence arrangement, the impurity ions can be sufficiently activated and the crystalline defect caused by the ion implantation can be fully restored without being limited by the heat resistance of the silicide film. The junction leakage current can be reduced mainly because the nitrogen atoms restore the crystalline defect and prevent the high-melting-point metal from being trapped into the crystalline defect.

Also, it is preferable that the gate electrode forming step includes the sub-steps of:
  forming a gate oxide film;
  depositing a polysilicon film on the gate oxide film;
  depositing a silicon nitride film on the polysilicon film; and
  patterning the polysilicon film and silicon nitride film formed atop of the same.

According to this arrangement, the silicon nitride film formed on the polysilicon film serves as a barrier when the wafer is open to air, cleaned, and coated with a photoresist, so that oxygen will not penetrate into the polysilicon film far deep inside, thereby further eliminating the "O" components before the silicidation reaction takes place later. As a result, the resulting silicide film renders excellent heat resistance and low resistance, and does not agglomerate even in the form of a line of 0.25 $\mu$m or less wide.

Further, it is preferable that the sub-step of patterning the polysilicon film includes the etching of the polysilicon film using the silicon nitride film as a mask. Accordingly, the nitride film forming the ground serves as a anti-reflection film, and therefore, the shape of the photoresist mask in the lower end can be improved drastically. In addition, the nitride film mask is so thin compared with the photoresist mask that an error in finished dimensions before and after forming the mask can be reduced significantly. Further, since the gate electrode is etched into the polysilicon film after the resist mask is removed, the impurity contained in the resist does not give any adverse effect during the etching. Thus, the selectivity of the etching rate with respect to the gate oxide film can be increased by a factor of 2 or greater. Consequently, there will be no damage to a surface portion of the Si-substrate which will be made into the source and drain regions. Also, since less reaction product is deposited during the etching compared with the conventional method using a resist mask, there will be no compression dependency. In addition, since the polysilicon film which will be made into the gate electrode is etched before doping the impurity, it renders high electric resistance compared with a conventional $n^+$-doped material. Hence, the polysilicon film is hardly affected by the charges and the damage to gate dielectric films and side etching (notching) in the lower end of the gate electrode are eliminated. As a result, it has become possible to fabricate a semiconductor device as precise as the design dimension and causing less damage to the Si-substrate.

To fulfill the second object, it is preferable that a process of fabricating a semiconductor device by using the CMOS technique is arranged in the following manner:

the step of doping an impurity that form the second impurity diffusion region in the p-well side through the ion implantation, and the step of doping an impurity that form the second impurity diffusion region in the n-well side through the ion implantation are carried out before the gate electrode sidewall dielectric film is formed and after the gate electrode is formed;

the step of doping an impurity that form the first impurity diffusion region in the p-well side through the ion implantation, and the step of doping an impurity that form the first impurity diffusion region in the n-well side through the ion implantation are carried out after the gate electrode sidewall dielectric film is formed; and the step of doping an impurity that form the third impurity diffusion region in the p-well side through the ion implantation, and the step of doping an impurity that form the third impurity diffusion region in the n-well side through the ion implantation are carried out after the high-melting-point metal silicide film is formed.

Accordingly, the annealing conditions to activate the impurity can be set separately in the n-channel side and p-channel side. As a result, it has become possible to fabricate a CMOS device having a salicide n-channel capable of reducing the junction leakage and a salicide p-channel capable of suppressing the short-channel effects.

For a fuller understanding of the nature and advantages of the invention, reference should be made to the ensuing detailed description taken in conjunction with the accompanying drawings.

BRIEF DESCRIPTION OF THE DRAWINGS

FIG. 2 is a view showing a sectional structure of a modification of the above semiconductor device;

FIG. 4(a) is a sectional view explaining a conventional fabrication sequence of a gate electrode of a transistor, and it shows a step of forming films;

FIG. 4(b) is a sectional view explaining the above conventional fabrication sequence, and it shows a step of etching a photoresist;

FIG. 4(c) is a sectional view explaining the above conventional fabrication sequence, and it shows a step of etching a polysilicon film;

FIG. 4(d) is a sectional view explaining the above conventional fabrication sequence, and it shows a step of forming a silicide film;

DESCRIPTION OF THE EMBODIMENTS

The following embodiments will describe example semiconductor devices and processes of fabricating the same in accordance with the present invention.

First Embodiment

Figure 1:
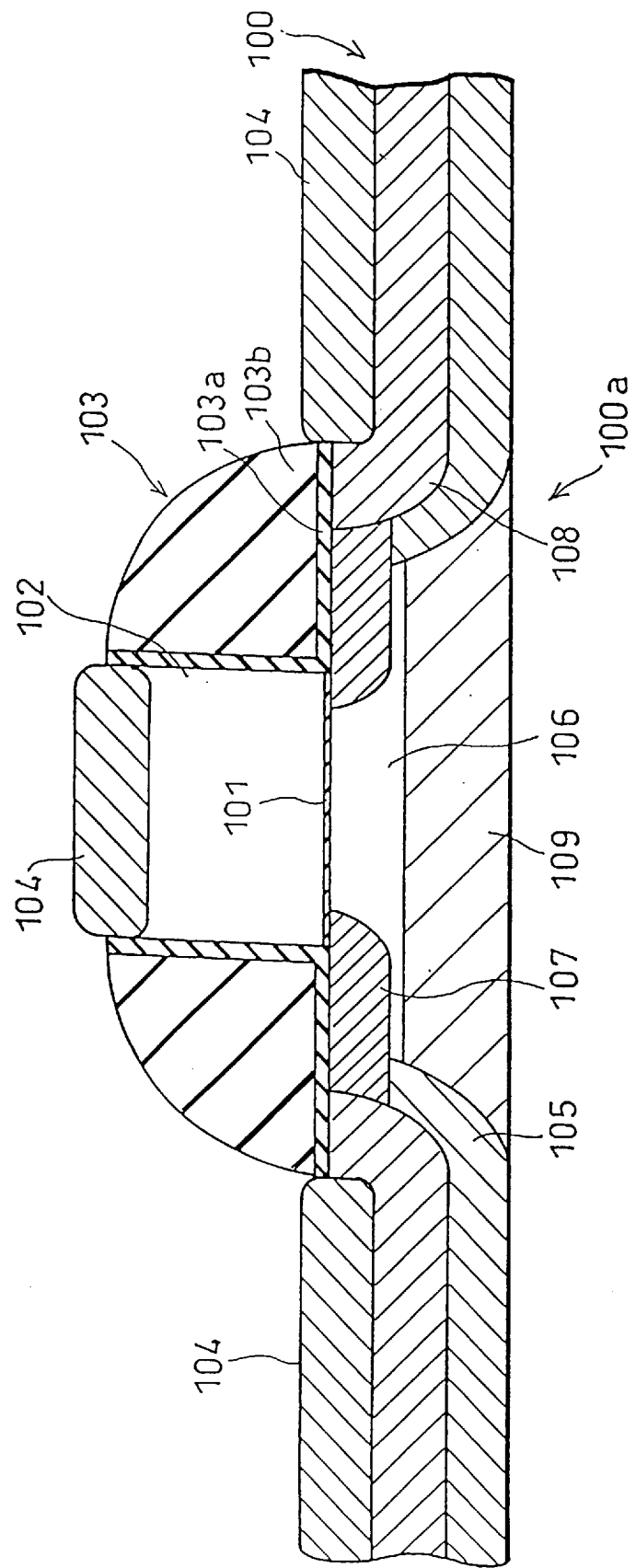
FIG. 1 is a view showing a sectional structure of a semiconductor device in accordance with a first embodiment of the present invention.

FIG. 1 is a view showing a sectional structure of a first embodiment of the present invention.

Herein, a silicon semiconductor substrate (hereinafter, referred to as Si-substrate) 100 includes, on the surface thereof, a p-well region 100a having a concentration of about $5 \times 10^{16} - 1 \times 10^{17}/cm^3$, and an n-type gate electrode 102 of 120 nm thick and 180 nm long is formed within the p-well region 100a through a gate oxide film 101 of about 4 nm thick. Two gate electrode sidewall dielectric films 103 are formed in the two opposing sides of the gate electrode 102, respectively. Each gate electrode sidewall dielectric film 103 comprises a double-layer film: a silicon nitride film 103a of about 10 nm thick and a silicon oxide film 103b of about 140 nm thick. Further, titanium silicide films 104 of about 50 nm thick are formed on the Si-substrate 100 in the two opposing sides of the gate electrode sidewall dielectric films 103 and on the gate electrode 102.

The p-well region 100a also includes two first impurity diffusion regions 105 in the two opposing sides of the gate electrode 102 through the gate electrode sidewall dielectric films 103, respectively. The two first impurity diffusion regions 105 will be made into parts of source and drain regions, respectively. Each first impurity diffusion region 105 has a conductivity type (n-type) reversed to that of the p-well region 100a. The junction depth and a peak concentration of each first impurity diffusion region 105 are set to about 120 nm and $5 \times 10^{17} – 5 \times 10^{18}/cm^3$, respectively.

Further, two n-type second impurity diffusion regions 107 are respectively formed beneath the two gate electrode sidewall dielectric films 103 in such a manner to be adjacent to a channel region 106 formed directly below the gate electrode 102. The junction depth of each second impurity diffusion region 107 is shallower than that of the first impurity diffusion regions 105. The junction depth and a peak concentration of each second impurity diffusion region 107 are set to about 40 nm and $1 \times 10^{19} – 5 \times 10^{19}/cm^3$, respectively.

In addition, an n-type third impurity diffusion region 108 is formed within each first impurity diffusion region 105 in such a manner to touch at least the bottom surface of the titanium silicide film 104 formed on the surface of the Si-substrate 100. A peak concentration of each third impurity diffusion region 108 is set to higher than that of the rest portions of the first impurity diffusion region 105, for example, $1 \times 10^{20}/cm^3$ or higher.

A fourth impurity diffusion region 109 having a conductivity type (p-type) reversed to that of the first impurity diffusion region 105 is formed beneath the channel region 106. A peak concentration and a peak depth of the fourth impurity diffusion region 109 are set to $2 \times 10^{17} – 1 \times 10^{18}/cm^3$ and 80–100 nm, respectively.

According to the present embodiment, fairly shallow diffusion regions, that is, the n-type second impurity diffusion regions 107, are formed around the transistor channel, thereby realizing a structure capable of suppressing the short-channel effects. On the other hand, fairly deep junctions, that is, the n-type first impurity diffusion regions 105, are formed below the silicide regions. Thus, a sufficient distance can be secured between the silicide-silicon interface and the junction, thereby making it possible to reduce the junction leakage current. Further, since the concentration of the first impurity diffusion regions 105 is low, the depletion layer extends well downward at the junction portions between the first impurity diffusion regions 105 and p-well region 100a. In contrast, horizontal extension of the depletion layer resulted from the short-channel effects is curbed by the p-type fourth impurity diffusion region 109. Thus, this structure can suppress the short-channel effects while reducing the source-drain junction capacitance. Also, since the silicide-silicon interface is formed within the third impurity diffusion regions 108 having a fairly high donor concentration, ohmic contact is achieved between the silicide and silicon, thereby making it possible to increase a driving current.

Note that the length of the gate electrode 102, thickness of the gate electrode sidewall dielectric films 103 and silicide films 104, concentration or junction depth of each of the impurity diffusion regions 105, 107, 108, and 109 are not limited to the disclosure herein. These parameters can be optimized to fabricate a desired device using the above-structured transistor.

However, for further reference, preferred conditions and relationships are set forth below.

The concentration of the first impurity diffusion regions 105 is $1 \times 10^{17} – 5 \times 10^{19}/cm^3$, and the junction depth of the same is 50–300 nm; the concentration of the second impurity diffusion regions 107 is $5 \times 10^{18} – 5 \times 10^{19}/cm^3$, and the junction depth of the same is shallower than the first impurity diffusion regions 105, that is, 5–70 nm; the concentration of the third impurity diffusion regions 108 is $5 \times 10^{19}/cm^3$ or higher, and a peak concentration depth of the same is shallower than that of the first impurity diffusion regions 105, that is, 5–70 nm; and a peak concentration of the fourth impurity diffusion region 109 is lower than that of the first impurity diffusion regions 105, that is, $1 \times 10^{17} – 5 \times 10^{18}/cm^3$, and a peak concentration depth of the same is in a range from the peak concentration depth to the junction depth of the first impurity diffusion regions 105. The thickness of each gate electrode sidewall dielectric film 103 in a direction parallel to the main surface of the Si-substrate 100 is 0.7 times or more, more preferably 1.0–1.5 times, of the junction depth of the first impurity diffusion regions 105.

Although the present embodiment describes the n-channel transistor, a p-channel transistor can be of the same structure if the conductivity types of all the regions are reversed. Note that, however, in case of a conventional p-channel transistor, boron, introduced by the ion implantation to serve as an acceptor impurity, reacts with titanium atoms during titanium silicidation reaction to produce $TiB_2$, and drastically lowers the concentration of an acceptor, which would otherwise serve as a p-type carrier. Thus, the low-resistant and ohmic contact between $TiSi_2$ and the impurity diffusion region can be no longer maintained. As a result, the transistor parasitic serial resistivity increases drastically, even though the silicide film renders low resistance. The present invention is advantageous in that it eliminates this problem and makes it possible to achieve the silicide-silicon ohmic contact by forming the high-concentrated third impurity diffusion regions between silicide and silicon after the silicidation reaction.

When the short-channel effects are not suppressed sufficiently by the above structure, two fifth impurity diffusion regions 110 having a conductivity type reversed to that of the first impurity diffusion regions 105 may be formed respectively in junction regions, that is, on the side surface of the first impurity diffusion regions 105 in the gate electrode 102 side as shown in FIG. 2. The fifth impurity diffusion regions 110 are formed by a tilted ion implantation using ions having a conductivity type reversed to that of the first impurity diffusion regions 105 after the gate electrode sidewall dielectric films 103 are formed. The ions are doped in such a manner that the peak concentration of each fifth impurity diffusion region 110 approximates to the junction portion of the first impurity diffusion region 105, which is indicated by the line b–b'. The ion implantation through the gate electrode sidewall dielectric films 103 is advantageous in increasing the concentration around the junction portions of the first impurity diffusion regions 105 alone.

To fabricate the above-structured transistor, boron ions are doped as an impurity that will form the fourth impurity diffusion region 109, before the gate oxidizing step, into the Si-substrate 100 to a $6 \times 10^{12} – 1 \times 10^{13}/cm^3$ dose at 10–20 KeV through the ion implantation.

Arsenic ions are doped as an impurity that will form the second impurity diffusion regions 107, before the gate electrode sidewall dielectric films 103 are formed, into the Si-substrate 100 to a $5 \times 10^{13} – 5 \times 10^{14}/cm^3$ dose at 10–30 KeV through the ion implantation. In case of the p-channel, other elements, such as boron ions and indium ions, of substantially an equal implantation dose are doped at an adequate implantation energy for the ion seed.

Phosphorous ions are doped as an impurity that will form the first impurity diffusion regions 105, after the gate electrode sidewall dielectric films 103 are formed, into the Si-substrate 100 to a $1\times10^{13}$–$5\times10^{14}$/cm$^3$ dose at 10–30 KeV through the ion implantation (in case of arsenic ions, the energy is increased to, for example, 60–80 KeV). In case of the p-channel, other elements, such as boron ions and indium ions, of substantially an equal implantation dose are doped at an adequate implantation energy for the ion seed.

Arsenic ions are doped as an impurity that will form the third impurity diffusion regions 108, after a high-melting-point metal silicide film serving as the titanium silicide films 104 is formed, into the Si-substrate 100 to a $1\times10^{15}$–$1\times10^{16}$/cm$^3$ dose at 20–50 KeV through the ion implantation. In case of the p-channel, other elements, such as boron ions and indium ions, of substantially an equal implantation dose are doped at an adequate implantation energy for the ion seeds.

In the steps of introducing the impurities to form the n-type first and second impurity diffusion regions 105 and 107, the ion implantation is performed through a silicon nitride film deposited on the surface of the Si-substrate 100 without the presence of a natural oxide film.

A method of depositing the silicon nitride film without the presence of a natural oxide film will be described below. The silicon nitride film is deposited by an LP-CVD apparatus 10 equipped with a preliminary evacuation chamber 11 and a nitrogen-purged load lock chamber 12 as shown in FIG. 5(*a*). To begin with, a wafer whose natural oxide film on the surface is removed, is transported to the preliminary evacuation chamber 11, and after the evacuation, the wafer is further transported to the nitrogen-purged load lock chamber 12 filled with nitrogen atmosphere and keeping a dew point at $-100°$ C. or below.

After water molecules adhering onto the surface of the wafer are removed in the nitrogen-purged load lock chamber 12, the wafer is transported to a deposition preliminary chamber 13a shown in FIG. 5(*b*) where a dew point is kept at $-100°$ C. or below. Then, the wafer is transported to a silicon nitride film depositing chamber furnace main body 13b where the temperature in nitrogen atmosphere is kept at $400°$ C., and the temperature of the silicon nitride film depositing chamber furnace main body 13b is raised to $700°$ C. in the atmosphere of SiH$_2$Cl$_2$10 sccm and NH$_3$100 sccm under a reaction pressure of 15 Pa. As a result, a silicon nitride film is deposited on the wafer.

The LP-CVD apparatus 10 used herein removes water molecules adhering onto the surface of the wafer by including the preliminary evacuation chamber 11 and nitrogen-purged load lock chamber 12. To be more specific, with a conventional LP-CVD apparatus, the surface of the wafer is oxidized by the water molecules adhering thereon while it is transported to the high-temperature furnace (silicon nitride film depositing chamber furnace 13) where a nitride film is deposited, thereby forming a silicon oxide film at the interface of the silicon nitride film and Si-substrate. In contrast, the LP-CVD apparatus 10 of the present embodiment can eliminate the silicon oxide film from the interface almost perfectly by removing the water molecules adhering onto the surface of the wafer.

In the step following the ion implantation to form the n-type first and second impurity diffusion regions 105 and 107, the impurities are activated, before the high-melting-point metal silicide films 104 are formed, at $850°$ C.–$900°$ C. for 10–30 minutes in nitrogen atmosphere while preventing the outward diffusion using the nitride film as a barrier.

Next, the steps of forming the titanium silicide films 104 and introducing an impurity that will form the third impurity diffusion regions 108 will be described below. Herein, a cluster type apparatus equipped with an argon sputter cleaning chamber and a titanium sputter chamber and having a base pressure of $1-3\times10^{-8}$ torr is used. To be more specific, after the n-type first and second impurity diffusion regions 105 and 107 are formed (after the impurities are activated by the thermal annealing using the titanium nitride film as an ion implantation cap), the silicon nitride film is etched by argon sputtering and the wafer is transported in vacuum to the titanium sputter chamber, where titanium is sputter-deposited. The above-structured apparatus can deposit a titanium film without forming a natural oxide film in the interface of an activation region of the Si-substrate and the deposited titanium film. Note that pure metal titanium (titanium target purity of 99.9999%) is sputter-deposited herein. Next, silicon is doped through the ion implantation in such a manner that a projection range (Rp) comes in the interface of the titanium nitride film, activation region (source and drain regions), and gate polysilicon. By so doing, silicon and titanium near the interface intermix, which facilitates the initial silicidation reaction. Then, a first RTA (Rapid Thermal Annealing) is performed at $575°$ C.–$700°$ C. (herein, $675°$ C.) for about ten seconds in nitrogen atmosphere to form a titanium silicide film having a TiSi$_2$ C49 crystal structure through a titanium-silicon reaction in the silicon film side (gate polysilicon, and source and drain regions of the Si-substrate side), turning the main surface side of the deposited titanium film into a titanium nitride film. At this point, no silicon is supplied to a region (the field oxide films 103a, gate electrode sidewall oxide films 103b, etc) where the silicon film (Si-substrate) is not exposed, and no titanium silicide film is formed in such a region. That is to say, the titanium silicide films 104 are formed in a self-aligned manner only in the region (source, drain, and gate regions) where the silicon film (Si-substrate) is exposed. Then, arsenic ions are doped to a $1\times10^{15}$–$1\times10^{16}$/cm$^3$ dose at 20 KeV–40 KeV through the ion implantation to form the third impurity diffusion regions 108. Then, after the titanium nitride film and unreacted titanium film are removed using a mixed solution of sulfuric acid and aqueous hydrogen peroxide, a second RTA is performed at $950°$ C.–$1000°$ C. (herein, $1000°$ C. for ten seconds) to let the titanium silicide films 104 transform to the ones having a stable stoichiometric TiSi$_2$ C54 crystal structure, and to activate arsenic ions doped to form the n-type third impurity diffusion regions 108.

Note that the description of the sectional views explaining the fabrication sequence is omitted herein and will be described in a third embodiment below that discloses a CMOS device.

Second Embodiment

FIGS. 3(*a*) through 3(*d*) are views explaining the fabrication sequence in accordance with the second embodiment, while FIGS. 4(*a*) through 4(*d*) are views explaining a conventional fabrication sequence for comparison.

A process of fabricating a transistor gate electrode, and influence on a silicide film will be described herein.

As shown in FIG. 3(*a*), a gate oxide film 202 of about 2.5–4 nm thick, a polysilicon film 203 of about 100–150 nm thick which will be made into a gate electrode, and a silicon nitride film 204 of about 10–30 nm thick are sequentially formed on a silicon semiconductor substrate (hereinafter, referred to as Si-substrate) 201.

Figure 5A:
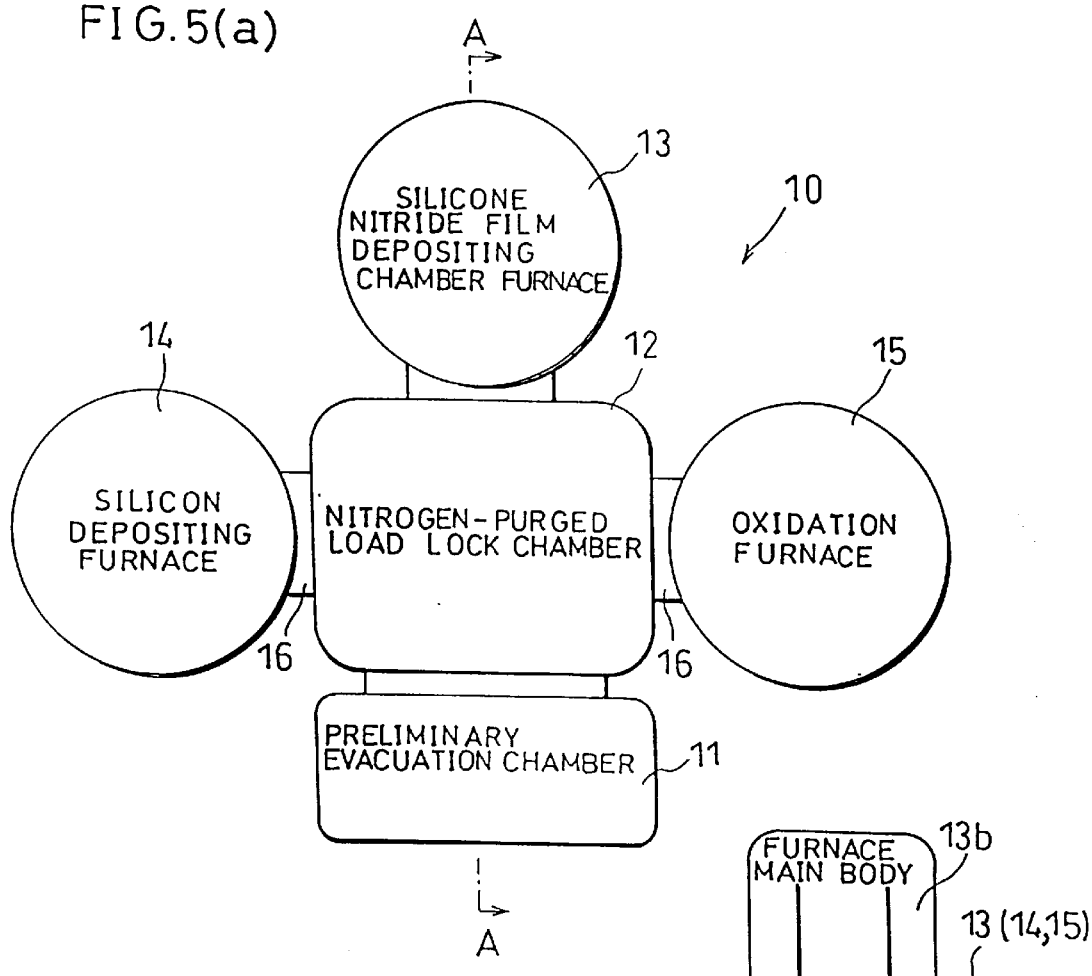
FIG. 5(a) is a plan view of an apparatus of fabricating a semiconductor device in accordance with each embodiment of the present invention.
Figure 5B:
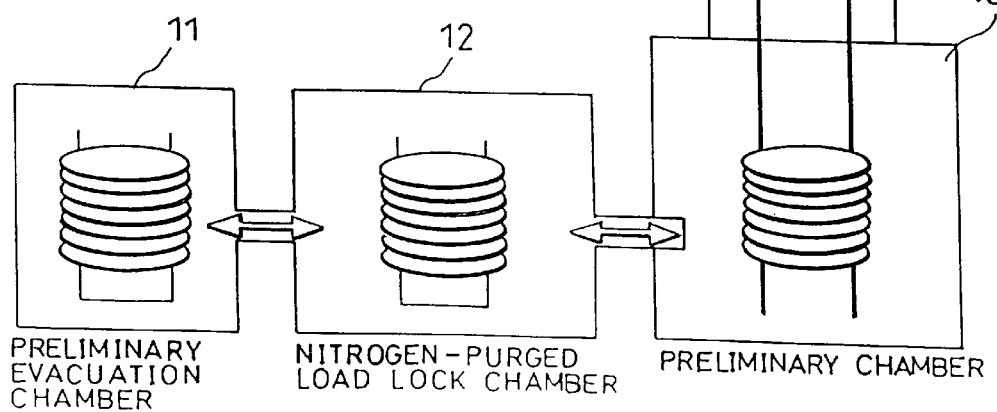
FIG. 5(b) is a perspective sectional view taken on line A–A' of FIG. 5(a)

Each film is formed by an LP-CVD apparatus 10 shown in FIGS. 5(*a*) and 5(*b*). FIG. 5(*a*) is a plan view of the LP-CVD apparatus 10 and FIG. 5(*b*) is a perspective sectional view taken on line A–A' of FIG. 5(a). The LP-CVD apparatus 10 includes a preliminary evacuation chamber 11, a nitrogen-purged load lock chamber 12, a silicon nitride film depositing chamber furnace 13, a silicon depositing furnace 14, an oxidation furnace 15, and nitrogen-purged transportation systems 16 connecting the nitrogen-purged load lock chamber 12 to the rest of the chamber and furnaces 11, 13, 14, and 15 individually. AS shown in FIG. 5(b), the furnaces 13, 14, and 15 respectively include preliminary chambers 13a, 14a and 15a connected to the transportation systems 16 and furnace main bodies 13b, 14b, and 15b.

With the LP-CVD apparatus 10, the wafer whose natural oxide film is removed through hydrofluoric acid treatment in advance is transported to the preliminary evacuation chamber 11, and vacuumed to about $10^{-1}$ Pa; at this point, $H_2O$ molecules adhering onto the surface of the wafer are removed, albeit insufficiently.

Next, the preliminary evacuation chamber 11 is filled with nitrogen, and the wafer is transported in nitrogen atmosphere to the nitrogen-purged load lock chamber 12 where a dew point is kept at −100° C. or below and $H_2O$ molecules adhering onto the surface thereof are removed through the nitrogen purge.

Then, the wafer is transported in the following sequence: preliminary chamber 15a, oxidation furnace 15b (forming a gate oxidation film), preliminary chamber 15a, nitrogen-purged load lock chamber 12, preliminary chamber 14a, silicon depositing furnace 14 (depositing a polysilicon gate electrode), preliminary chamber 14a, nitrogen-purged load lock chamber 12, preliminary chamber 13a, and silicon nitride film depositing chamber furnace 13 (depositing a silicon nitride film).

The gate oxide film 202 is formed in the oxidation furnace 15 in the following manner: the wafer is transported from the nitrogen-purged preliminary chamber 15a keeping a dew point at −100° C. or below to the oxidation furnace main body 15b where the temperature is kept at 400° C.–700° C. and $N_2O$ or $O_2$ purge (100 sccm) is being performed. Then the temperature of the oxidation furnace main body 15b is raised to 800° C.–950° C., and as a result, the wafer is oxidized in oxygen atmosphere.

The polysilicon film 203 is deposited in the following manner. To begin with, the wafer is transported to the nitrogen-purged load lock chamber 12 in nitrogen atmosphere immediately after the gate oxide film 202 is formed, and the wafer is transported further to a silicon depositing furnace 12b kept at 620° C. in nitrogen atmosphere by way of a nitrogen-purged preliminary chamber 12a keeping a dew point at −100° C. or below. Then, the polysilicon film 203 is formed at approximately 620° C. under a pressure of 30 Pa in the atmosphere of $SiH_4$ having a purity of 99.9999% or higher through the LP-CVD method in the silicon depositing furnace 12b. The oxygen concentration of the film thus formed is equal to or lower than the detection limit ($1\times10^{18}$ pcS/cm$^3$) of the SIMS analysis. Thus, the film can be defined as a polysilicon film having an extremely low oxygen concentration.

The silicon nitride film 204 is deposited in the following manner. To begin with, the wafer is transported to the nitrogen-purged load lock chamber 12 in nitrogen atmosphere immediately after the gate polysilicon film 203 is deposited, and the wafer is transported further to the silicon nitride film depositing furnace 13b kept at 400° C. in nitrogen atmosphere by way of the nitrogen-purged preliminary chamber 13a keeping a dew point at −100° C. or below. Then, the temperature of the silicon nitride film depositing furnace 13b is raised to 700° C. in the atmosphere of $SiH_2Cl_2$ 10 sccm and $NH_3$ 100 sccm under a reaction pressure of 15 Pa to deposit the silicon nitride film 204 through the LP-CVD method.

According to the present embodiment, the fabrication sequence starting with the step of forming the gate oxide film and ending with the step of depositing the silicon nitride film can be carried out without permitting the passage of air. The gate oxide film 202, which is formed by the LP-CVD apparatus 10 without the presence of a natural oxide film in the oxidation step in the above manner, is hardly susceptible to the contamination and has a fewer surface states, thereby rendering high reliability.

Also, the LP-CVD apparatus 10 removes water molecules adhering onto the surface of the wafer by including the preliminary evacuation chamber 11 and nitrogen-purged load lock chamber 12. Also, as previously mentioned, the nitrogen-purged load lock chamber 12 is connected to the furnaces 13, 14, 15 individually through the air-free transportation systems 16. This arrangement makes it possible to eliminate the silicon oxide film from the interface. Further, the polysilicon film 203 which will be made into the gate electrode will not be open to air until the silicidation step. In addition, when the wafer is open to air, the silicon nitride film 204 formed on the surface of the polysilicon film 203 serves as a barrier. Therefore, unlike the conventional method, oxygen does not penetrate far deep into the polysilicon film 203 along the crystal grain boundary from the surface.

In the conventional method, as shown in FIG. 4(a), a gate oxide film 2002 of about 2.5–4 nm thick and a polysilicon film 2003 of about 100–150 nm thick which will be made into a gate electrode are sequentially formed on a silicon semiconductor substrate (hereinafter, referred to as Si-substrate) 2001. Here, the wafer is open to air after the gate oxide film 2002 and polysilicon film 2003 are formed. In addition, the wafer is susceptible to contamination in the air before the gate oxidation, and the oxidation step is carried out in the presence of a natural oxide film of 1–2 nm thick. Therefore, the resulting gate oxide film 2002 has numerous surface states and renders poor reliability. The surface of the polysilicon film 2003 is always exposed to contamination (air, photoresist, etc.), and contamination (especially oxygen) penetrates far deep into the polysilicon film 2003 along the crystal grain boundary from the surface. When the polysilicon film 2003 is deposited using an LP-CVD apparatus that transports the wafer to the depositing furnace directly through air, the concentration of oxygen contained in the deposited polysilicon film 2003 becomes extremely high (as high as $10^{19}$/cm$^3$ is acknowledged by the SIMS analysis).

Figure 3A:
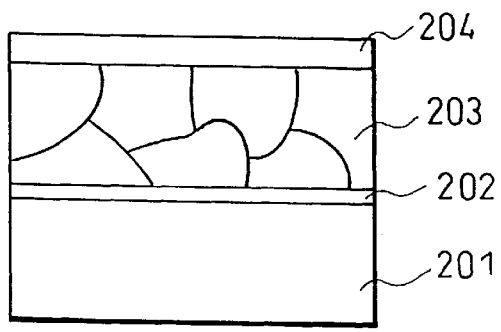
FIG. 3(a) is a sectional view explaining a fabrication sequence of a gate electrode of a transistor in accordance with a second embodiment of the present invention, and it shows a step of forming films including a silicon nitride film.
Figure 3B:
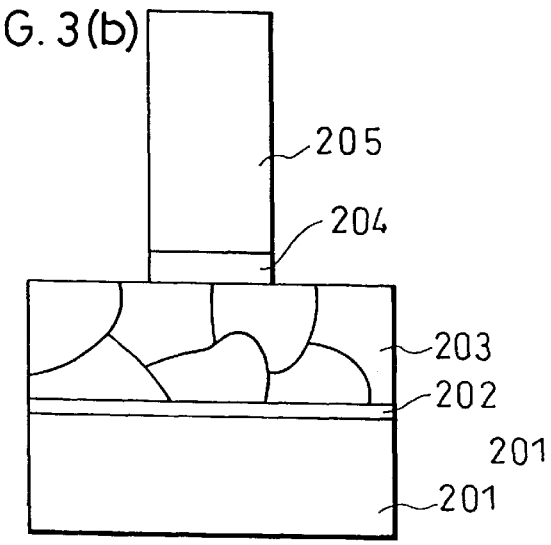
FIG. 3(b) is a sectional view explaining the above fabrication sequence, and it shows a step of etching a photoresist and the silicon nitride film.

Then, as shown in FIG. 3(b), the silicon nitride film 204 is etched into a desired pattern using a photoresist 205 as a mask. The silicon nitride film 204 is etched with a commercially available ECR etching device under the conditions as follow:

gas: $CF_4$=40 sccm
pressure=665 mPa (5 mTorr)
high-frequency bias power=50 W
microwave anode current=200 mA
stage temperature=−30° C.

On the other hand, in the conventional method, a photoresist 2004 directly coats the polysilicon film 2003 as is shown in FIG. 4(b).

Figure 3C:
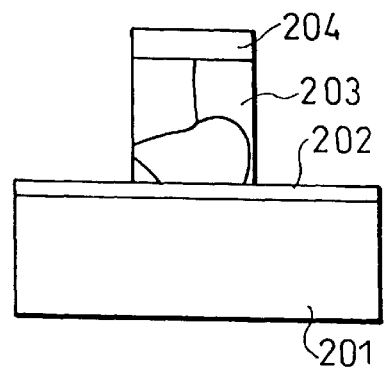
FIG. 3(c) is a sectional view explaining the above fabrication sequence, and it shows a step of etching a polysilicon film.

Then, as shown in FIG. 3(c), the polysilicon film 203 is etched into a desired gate electrode pattern using the silicon nitride film 204 as a mask after the photoresist 205 is removed. The polysilicon film 203 is etched by the above-mentioned ECR etching device under the following conditions.

The etching includes two steps, and the conditions in each are as follow:

Break through Conditions
Cl$_2$=40 sccm
pressure=665 mPa (5 mTorr)
high-frequency bias power=40 W
microwave anode current=200 mA
stage temperature=20° C.
Main Etching Conditions
HBr/Cl$_2$/O$_2$=18/9/3 sccm
pressure=133 mPa (1 mTorr)
high-frequency bias power=20 W
microwave anode current=350 mA
stage temperature=20° C.
time=39 seconds (etching amount: 30% over)
selection ratio: 300 or higher Under these conditions, the silicon nitride film 204 is used as a mask, which results in the following advantages:

(1) since the silicon nitride film 204 forming the ground serves as an anti-reflection film, the shape of the photoresist 205 serving as a mask in the lower end is improved drastically;

(2) since the silicon nitride film 204 serving as a mask is so thin, there will be substantially no error in finished dimensions before and after forming the mask;

(3) since the polysilicon film 203 is etched into the gate electrode using the silicon nitride film 204 as a mask after the photoresist 205 is removed, the etching is performed without the presence of the impurities contained in the photoresist 205, and therefore, the selectivity of the etching rate with respect to the gate oxide film 202 is increased by a factor of 2 or greater, thereby eliminating the damage to the surface of the Si-substrate 201 which will be made into the source and drain regions;

(4) since less reaction product is deposited during the etching compared with the conventional method using the photoresist 2004 as a mask, there will be no compression dependency; and (5) since the polysilicon film 203 which will be made into the gate electrode is etched before doping the impurity, it renders high electric resistance compared with a conventional n$^+$-doped material, and hence, it is hardly affected by the charges and eliminates the damages to the gate dielectric films or side etching (notching) in the lower end of the gate electrode.

On the contrary, in the conventional method shown in FIG. 4(c), the gate electrode is etched into the polysilicon film 2003 using the photoresist 2004 as a mask. Therefore, even the etching conditions are identical, carbon-containing components in the photoresist or product as a result of the silicon etching reacts with oxygen atoms or halogen atoms in plasma, and forms deposit films 2005 on the sidewalls of the photoresist 2004 serving as a mask and polysilicon film 2003. These deposit films 2005 prevent vertical etching and causes tapered etching instead. Consequently, the resulting gate electrode pattern is wider than the mask dimension (design dimension). In a system where the polysilicon film 2003 is etched using the photoresist 2004 as a mask, carbon-containing components in the photoresist 2004 make it impossible to take a selection ratio with the etching rate with respect to the oxide film (gate oxide film 2002) when etching the polysilicon film 2003. As the gate oxide film 2002 becomes thinner, the etching gas might penetrate through the gate oxide film 2002 and damage the surface of the Si-substrate 2001 at worst. Moreover, plasma of the etching gas may have a direct contact with the Si-substrate 2001, and contamination, such as "C", "F", "O", "Br", and "Cl", penetrates into the same from the surface.

Figure 3D:
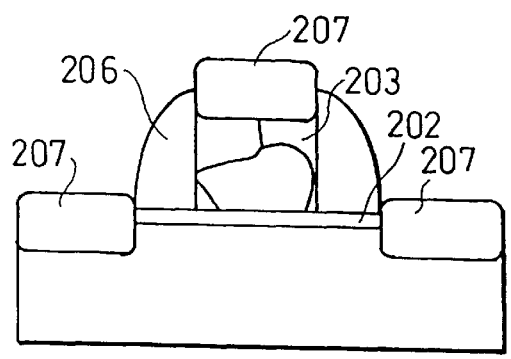
FIG. 3(d) is a sectional view explaining the above fabrication sequence, and it shows a step of forming a silicide film.

Next, as shown in FIG. 3(d), silicide films 207 are formed on regions which will be made into the gate electrode, and source and drain regions after the gate electrode sidewall dielectric films 206 are formed. Silicide films 207 are formed in the same manner as above in the conventional method as shown in FIG. 4(d).

The polysilicon film 203 of the present invention contains a small amount of contamination (especially, oxygen), and the contamination concentration of the Si-substrate 201 on the surface is low for the reason explained above. Thus, the resulting uniform silicide films 207 are uniform films of low resistance with excellent heat resistance. In contrast, the conventional polysilicon film 2003 contains a large amount of contamination (especially, oxygen), and the contamination concentration of the Si-substrate 2001 on the surface is high. Thus, the resulting silicide film 2007 is an irregular film of high resistance with poor heat resistance.

Third Embodiment

Herein, a CMOS device using transistors having the structure explained in the first embodiment will be described with reference to the fabrication sequence.

FIGS. 6(a) through 6(m) are sectional views showing the fabrication sequence in accordance with the third embodiment.

Figure 6A:
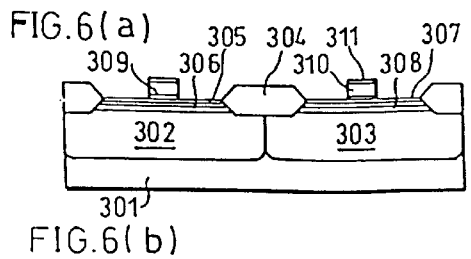
FIG. 6(a) is a sectional view explaining a fabrication sequence of a CMOS device in accordance with a third embodiment of the present invention, and it shows a step of producing a gate electrode.

To begin with, as shown in FIG. 6(a), a DZ zone is formed on a silicon semiconductor substrate (hereinafter, referred to as Si-substrate) 301 through the IG treatment using a known method (not shown). The IG treatment is advantageous in reducing the oxygen concentration of the Si-substrate 301 on the surface, which will otherwise cause a problem in a silicidation step below.

Then, a p-well 302 and an n-well 303 are formed followed by a field oxide film 304. Subsequently, the impurities are doped in the side of the n-channels 305 and 306 and in the side of the p-channels 307 and 308 to control a threshold voltage and suppress the short-channel effects. Then, a gate electrode 310 comprising a polysilicon film of 100–150 nm thick covered with a gate oxide film 309 at the bottom and a silicon nitride film 311 of 10–30 nm thick on the top is formed in each well in the manner explained in the second embodiment.

Figure 6B:
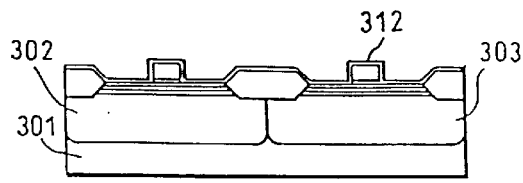
FIG. 6(b) is a sectional view explaining the above fabrication sequence, and it shows a step of forming a silicon nitride film.

Then, as shown in FIG. 6(b), a silicon nitride film 312 is deposited on each gate electrode 310 in a thickness of 5–30 nm in the method explained in the first and second embodiments, so that oxygen will not penetrate as far as the interface of the silicon nitride film 312 and Si-substrate 301.

Figure 6C:
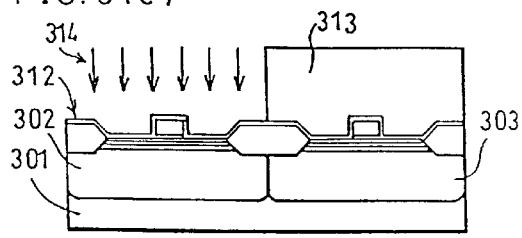
FIG. 6(c) is a sectional view explaining the above fabrication sequence, and it shows a step of implanting an impurity to form a shallow junction around a channel region in an n-channel side.

Next, as shown in FIG. 6(c), the p-channel side (n-well 303 side) is masked with a photoresist 313 after the photolithography step, and a shallow junction is formed near a channel region in the n-channel side (p-well 302 side) by doping an impurity 314 serving as a donor in the Si-substrate 301 through the ion implantation. In the present embodiment, arsenic ions are doped to a 1–3×10$^{14}$/cm$^3$ dose at 20–40 KeV through the ion implantation.

Figure 6D:
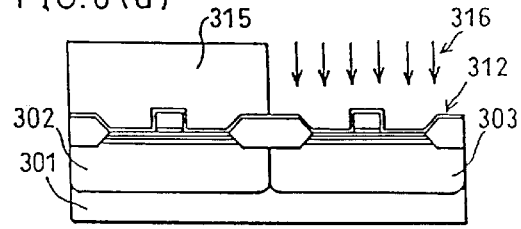
FIG. 6(d) is a sectional view explaining the above fabrication sequence, and it shows a step of implanting an impurity to form a shallow junction around the channel region in a p-channel side.

Then, as shown in FIG. 6(d), the n-channel side (p-well 302 side) is masked with a photoresist 315 after the photolithography step, and a shallow junction is formed near a channel region in the p-channel side (n-well 303 side) by doping an impurity 316 serving as an acceptor in the Si-substrate 301 through the ion implantation. In the present embodiment, indium ions are doped to a $1-3\times10^{14}/cm^3$ dose at 30–50 KeV through the ion implantation. Note that boron ions or the like can be also used as the ion seeds subject to the ion implantation; however, $BF_2$ ions are not preferable as fluorine penetrates into the Si-substrate 301.

Figure 6E:
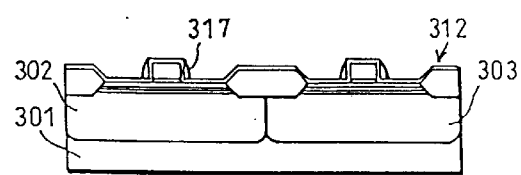
FIG. 6(e) is a sectional view explaining the above fabrication sequence, and it shows a step of forming a gate electrode sidewall oxide film.

Next, as shown in FIG. 6(e), the gate electrode sidewall oxide films 317 are formed. Herein, after the silicon oxide films 317 are deposited in a thickness of 100–300 nm, the oxide film is etched back until the surface of the silicon oxide films 317 exposes using a gas based on $C_4F_8$+Co having a selectivity ratio of 50–100 with respect to the silicon nitride film 312. In case of an etching system where the selectivity ratio of the silicon oxide film 317 to the silicon nitride film 312 can not be taken, the etching may be carried out until the activation region exposes. In this case, the silicon nitride film 312 is deposited again in a thickness of 5–30 nm in the same manner as described in the first and second embodiments, so that no oxygen penetrates as far as the interface of the silicon nitride film 312 and Si-substrate 301. However, if the etching is carried out until the activation region exposes, contamination based on "C" or "F" penetrates into the Si-substrate 301 from the surface, and such a contamination layer on the surface must be removed by the silicon etching or the like. Thus, it is preferable to use an etching system such that leaves the silicon nitride film 312, for example, an etching system using a strong chemical etching gas based on $C_4F_8$+CO.

Figure 6F:
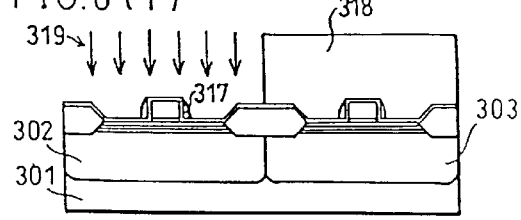
FIG. 6(f) is a sectional view explaining the above fabrication sequence, and it shows a step of implanting an impurity to form source and drain regions in the n-channel side.

Next, as shown in FIG. 6(f), after the p-channel side is masked by a photoresist 318 after the photolithography step, an impurity 319, which will serve as a donor in the Si-substrate 301, is doped through the ion implantation to form source and drain regions in the n-channel side. Herein, phosphorous ions are doped to a $1\times10^{13}-3\times10^{14}/cm^3$ dose at 20 KeV–60 KeV. The greater the energy and implantation dose, the more the impurity spreads horizontally, thereby degrading the short-channel effects. Thus, it is not preferable to increase an implantation dose and energy more than necessary, that is, exceeding a level such that forms the gate electrode sidewall oxide films 317 in a sufficient manner.

Figure 6G:
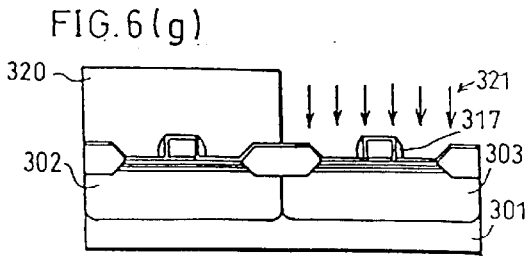
FIG. 6(g) is a sectional view explaining the above fabrication sequence, and it shows a step of implanting an impurity to form source and drain regions in the p-channel side.

Next, as shown in FIG. 6(g), after the n-channel side is masked with a photoresist 320 after the photolithography step, an impurity 321, which will serve as an acceptor in the Si-substrate 301, is doped through the ion implantation to form source and drain regions in the p-channel side. Herein, to prevent the channeling, silicon ions are doped first, and then, boron ions are doped to a $1\times10^{13}-3\times10^{14}/cm^3$ dose at 10 KeV–30 KeV. The greater the energy and implantation dose, the more the impurity spreads horizontally, thereby degrading the short-channel effects. Thus, it is not preferable to increase an implantation dose and energy more than necessary, that is, exceeding a level such that forms the gate electrode sidewall oxide films 317 in a sufficient manner.

Figure 6H:
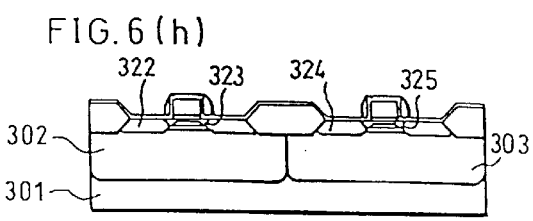
FIG. 6(h) is a sectional view explaining the above fabrication sequence, and it shows a step of annealing.

Next, as shown in FIG. 6(h), the Si-substrate 301 is subject to annealing in nitrogen atmosphere to activate the impurities and enables the same to restore crystal structure. Herein, the annealing is carried out at 850° C.–900° C. for 10–30 minutes. This thermal annealing activates the donor and acceptor doped respectively in the steps of FIGS. 6(c) and 6(d) and FIGS. 6(f) and 6(g) to form an n-type first impurity diffusion region 322, an n-type second impurity diffusion region 323, a p-type first impurity diffusion region 324, and a p-type second impurity diffusion region 325.

Figure 6I:
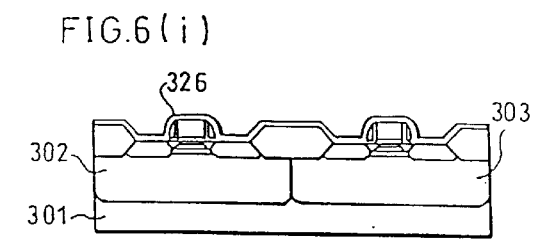
FIG. 6(i) is a sectional view explaining the above fabrication sequence, and it shows a step of depositing a titanium film.

Next, as shown in FIG. 6(i), after the silicon nitride films 311 and 312 are removed, a titanium film 326 of about 30 nm thick is deposited. Herein, a cluster type apparatus (not shown) equipped with an argon sputter cleaning chamber and a titanium sputter chamber and having a base pressure of $1\times10^{-8}-3\times10^{-8}$ torr is used. To be more specific, the silicon nitride films 311 and 312 are etched by argon-sputtering and the wafer is transported in vacuum to the titanium sputter chamber, where titanium is sputter-deposited. The above-structured apparatus can deposit a titanium film without forming a natural oxide film in the interface of an activation region of the Si-substrate and the deposited titanium film.

The following description will describe a process of forming a titanium silicide film using the above cluster type apparatus in detail. To begin with, immediately after the natural oxide film on the silicon nitride film 312 is removed, the wafer is placed in the load lock chamber (not shown). Then, the wafer is transported to the etching chamber (not shown) and the surface thereof is cleaned by removing the silicon nitride films 311 and 312. The argon sputter cleaning etching method is used herein. Then, the wafer is transported to the sputter chamber (not shown) in vacuum (herein $1\times10^{-8}-3\times10^{-8}$ torr), and a titanium film 326 is sputter-deposited in argon atmosphere. Pure metal titanium (titanium target purity: 99.9999%) is used herein.

Subsequently, silicon are doped to a $1\times10^{15}-1\times10^{16}/cm^3$ dose through the ion implantation, so that Rp comes in the interface of a titanium nitride film 327 which will be explained below, and the activation region (source and drain regions) and gate polysilicon. This silicon implantation causes to silicon and titanium around the interface to intermix, thereby facilitating the initial silicidation reaction.

Figure 6J:
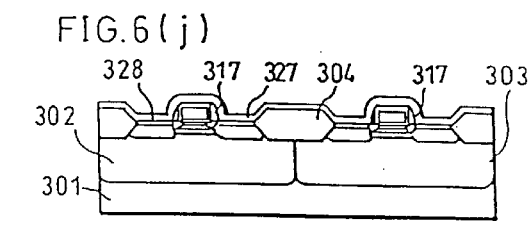
FIG. 6(j) is a sectional view explaining the above fabrication sequence, and it shows a step of a first rapid thermal annealing.

Next, as shown in FIG. 6(j), the wafer is subject to a first RTA at 575° C.–700° C. (herein, 675° C.) for about 10 seconds in nitrogen atmosphere to form a titanium silicide film 328 having a $TiSi_2$ C49 crystal structure through the titanium-silicon reaction in the silicon film (gate polysilicon and source and drain regions of the Si-substrate) side, thereby causing the surface side of the sputter-deposited titanium film 326 to convert into a titanium nitride film 327. At this point, in a region (gate electrode sidewall oxide films 317, field oxide film 304, etc) where the silicon film (Si-substrate) is not exposed, no titanium silicide film is formed because no silicon is supplied thereto. Thus, the titanium silicide film 328 is formed in a self-aligned manner only where the silicon film (Si-substrate) is exposed (source and drain, and gate regions). The titanium silicide film 328 thus formed in the present embodiment has low oxygen, carbon and fluorine concentration (less contaminated) on the surface of the Si-substrate subject to reaction, and has low concentration of impurities serving as the donor and acceptor. Thus, silicidation reaction takes place in a uniform manner and the resulting silicide film renders low resistance and excellent heat resistance.

Figure 6K:
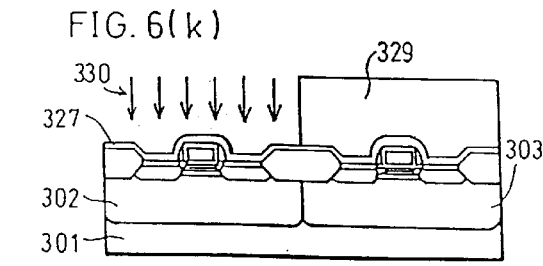
FIG. 6(k) is a sectional view explaining the above fabrication sequence, and it shows a step of implanting an impurity to form a third impurity diffusion region which will be made into the source and drain regions in the n-channel side.

Next, as shown in FIG. 6(k), after the p-channel side is masked with a photoresist 329 after the photolithography step, an impurity 330, which will serve as a donor in the Si-substrate 301, is doped through the ion implantation to form the source and drain regions in the n-channel side. Herein, arsenic ions are doped to a $1\times10^{15}-5\times10^{15}/cm^3$ dose at 20 KeV–40 KeV.

Figure 6L:
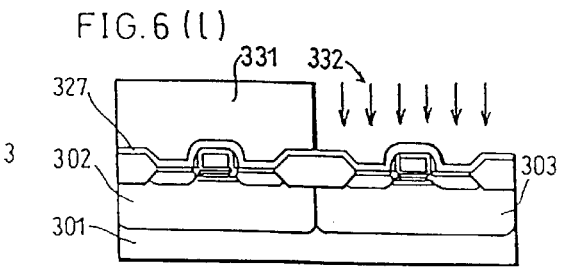
FIG. 6(l) is a sectional view explaining the above fabrication sequence, and it shows a step of implanting an impurity to form a third impurity diffusion region which will be made into the source and drain regions in the p-channel side.

Next, as shown in FIG. 6(l), after the n-channel side is masked by a photoresist 331 after the photolithography step, an impurity 332, which will serve as an acceptor in the Si-substrate 301, is doped through the ion implantation to form the source and drain regions in the p-channel side. Herein, boron ions are doped to a $1\times10^{15}-5\times10^{15}/cm^3$ dose at 10 KeV–20 KeV.

Note that the donor, acceptor, and implantation energy in the steps of FIGS. 6(k) and (l) should be set so that the depth of the resulting junctions does not exceed those formed by the ion implantation of FIG. 6(f) and 6(g).

Figure 6M:
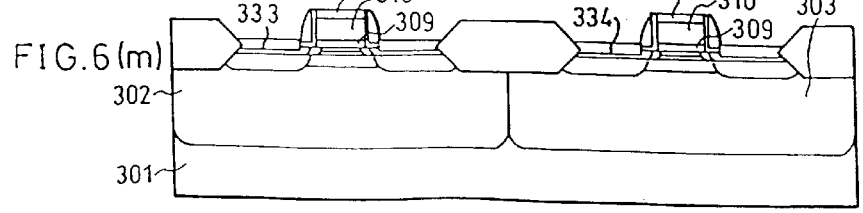
FIG. 6(m) is a sectional view explaining the above fabrication sequence, and it shows a step of a second rapid thermal annealing.
Figure 7A:
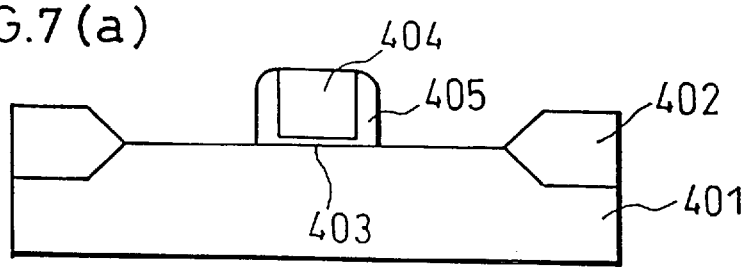
FIG. 7(a) is a sectional view explaining a conventional fabrication sequence of a semiconductor device, and it shows a step of producing a gate electrode.
Figure 7B:
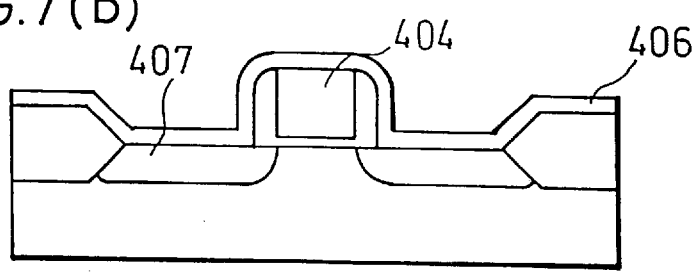
FIG. 7(b) is a sectional view explaining the above conventional fabrication sequence, and it shows a step of forming source and drain regions.
Figure 7C:
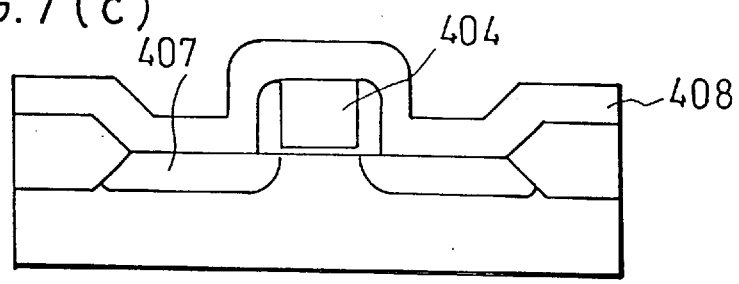
FIG. 7(c) is a sectional view explaining the above conventional fabrication sequence, and it shows a step of depositing a titanium film.
Figure 7D:
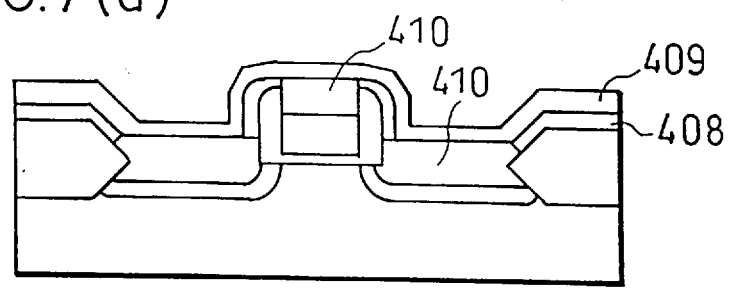
FIG. 7(d) is a sectional view explaining the above conventional fabrication sequence, and it shows a step of a first rapid thermal annealing.
Figure 7E:
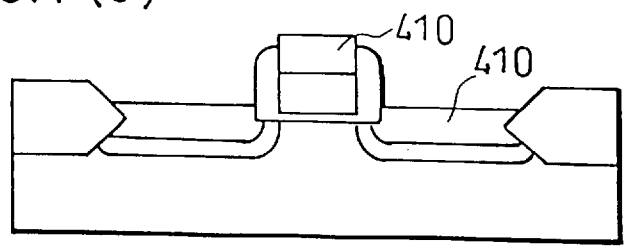
FIG. 7(e) is a sectional view explaining the above conventional fabrication sequence, and it shows a step of a second rapid thermal annealing.

Next, as shown in FIG. 6(m), after the titanium nitride film 327 and unreacted titanium film are removed by a mixed solution of sulfuric acid and aqueous hydrogen peroxide, the wafer is subject to a second RTA at 950° C.–1000° C. (herein, 1000° C. for 10 seconds). As a result, the titanium silicide film 328 is converted into a film having a stable stoichiometric $TiSi_2$ C54 crystal structure. Also, the donor and acceptor impurities respectively doped in the steps of FIGS. 6(k) and 6(l) are activated to form an n-type third impurity diffusion region 333 and a p-type third impurity diffusion region 334, respectively.

The rest of the sequence is identical with the conventional process and a desired CMOS device is fabricated as a result. As is well known, the wafer may be subject to a thermal annealing at 800° C.–900° C. after an interlayer dielectric film is deposited. Herein, the wafer is subject to the thermal annealing at 850° C. for 30 minutes in nitrogen atmosphere. This thermal annealing increases the penetrating speed of the impurities into the polysilicon film, and therefore, the donor and acceptor doped respectively in the steps of FIG. 6(k) and 6(l) can penetrate as far as the gate electrode 310 (polysilicon)/gate oxide film 309 interface, thereby making it possible to prevent the depletion of the gate electrode 310. However, this thermal annealing can be omitted if the second RTA can reduce the depletion to a negligible level (which depends on the thickness of the gate electrode 310 of polysilicon film and implantation energy).

The excellent property of the CMOS device of the present invention can be understood from the junction leakage currents of the diffusion regions in both the p-channel and n-channel of the CMOS device as follows:

area component: 1 $nA/cm^2$ or less (0.5–0.1 $nA/cm^2$)

peripheral component: 1 pA/cm or less (0.9–0.6 pA/cm)

It is also acknowledged that neither the sheet resistivity increases nor the heat resistance deteriorates even when the resulting film is used as a 0.18 pm-wide line. To be more specific, when the CMOS device is subject to the thermal annealing at 900° C. for 10 minutes, the 0.18 $\mu$m-wide line (gate electrode) maintains a sheet resistivity of 5Ω/sqr. It is also acknowledged that an n-channel transistor and a p-channel transistor, which are optimally designed for a transistor having a gate length of 0.18 $\mu$m and a 4 nm-thick gate oxide film, are hardly affected by the short-channel effects when their gate lengths are 0.18 $\mu$m.

As has been explained, the semiconductor device of the first embodiment includes at least:
- a polysilicon gate electrode formed on a Si-substrate through a gate oxide film;
- a sidewall dielectric film formed on the gate electrode sidewalls;
- source and drain regions made of an impurity diffusion region on the Si-substrate in the two opposing sides of the gate electrode; and
- a channel region sandwiched by the source and drain regions on the surface of the Si-substrate beneath the gate electrode.

The semiconductor device further includes a high-melting-point metal silicide film formed on the gate electrode and the surface of the Si-substrate in the two opposing sides of the sidewall dielectric film. Each of the source and drain regions comprises at least a second impurity diffusion region touching the channel region, a first impurity diffusion region offset to the channel region, and a third impurity diffusion region formed in the first impurity diffusion region. The three regions has following relationships: the second and third impurity diffusion regions are shallower than the first impurity diffusion region (in other words, the first impurity diffusion region is the deepest); and the first and second impurity diffusion regions has lower impurity concentration than the third impurity diffusion region (in other words, the third impurity diffusion region has the highest impurity concentration).

The above arrangement realizes four advantages as follow.

In the first place, since the first impurity diffusion region, which influences the source-drain junction leakage current, is deep, a sufficient distance can be secured from the interface between the high-melting-point metal silicide film and silicon to the junction, thereby making it possible to reduce the junction leakage current.

In the second place, since the second impurity diffusion region is extremely shallow, the short-channel effects of the transistor can be suppressed even though the first impurity diffusion region is deep.

In the third place, since the high-concentrated third impurity diffusion region is formed in the first impurity diffusion region, ohmic contact between the impurity diffusion regions and high-melting-point metal silicide film can be achieved, thereby reducing the contact resistance therebetween. In addition, since the concentration of the second impurity diffusion region is relatively high, a parasitic resistance around the source and drain can be reduced.

Finally in the fourth place, the parasitic capacity of the source and drain regions, if each of the source and drain has a specific area, is predominately determined by an extension degree of the depletion layer, which depends on the concentration of the first impurity diffusion region. Since the concentration of the first impurity diffusion region is low, the depletion layer extends well, thereby making it possible to reduce the junction capacitance.

These four advantages makes it possible to provide a less-power-consuming transistor having a high driving force.

In addition to the above arrangement, the above semiconductor device includes a fourth impurity diffusion region of the second conductivity type in the Si-substrate below the gate electrode so as to touch the first impurity diffusion region. This arrangement curbs the horizontal extension of the depletion layer of the first impurity diffusion region, and becomes effective in preventing the punchthrough in the bulk. As a result, it has become possible to provide a transistor structure capable of suppressing the short-channel effects.

Further, the above semiconductor device includes a fifth impurity diffusion region of the second conductivity type formed in the fourth impurity diffusion region at a portion touching at least the first impurity diffusion region. This arrangement can further curb the horizontal extension of the depletion layer of the first impurity diffusion region, and becomes more effective in preventing the punchthrough of the bulk. As a result, it has become possible to provide a transistor structure capable of further suppressing the short-channel effects.

As previously mentioned in the first embodiment, it is preferable to set the concentration of the impurity and depth of each of the first through third impurity diffusion region as follow.

The concentration and the junction depth of the first impurity diffusion region are set to $1 \times 10^{17} – 5 \times 10^{19}/cm^3$ and 70–300 nm, respectively. Setting within these ranges makes it possible to reduce the junction leakage current.

The concentration and the junction depth of the second impurity diffusion region are set to $5\times10^{18}$–$5\times10^{19}/cm^3$ and 5–70 nm, respectively. Setting within these ranges makes it possible to maintain relatively high impurity concentration in the source and drain regions around the channel while making the junction shallow. Therefore, not only the parasitic resistance at the ends of the source and drain regions of the transistor can be reduced, but also the short-channel effects can be suppressed.

The peak concentration and the peak concentration depth of the third impurity diffusion region are set to $5\times10^{19}/cm^3$ or higher and 5–70 nm, respectively. Setting within these ranges enables low-resistance contact between the high-melting-point metal silicide film and second impurity diffusion region, thereby reducing the parasitic resistance at the ends of the source and drain regions of the transistor.

In other words, forming the source and drain regions with the above first through third impurity diffusion regions makes it possible to realize two conflicting advantages at the same time: reducing the junction leakage current and suppressing the short-channel effects. As a result, it has become possible to provide a less-power-consuming transistor having a high driving force.

Further, it is preferable that the peak concentration of the fourth impurity diffusion region is lower than that of the first impurity diffusion region, that is, $1\times10^{17}$–$5\times10^{18}/cm^3$, and the peak concentration depth of the fourth impurity diffusion region is in a region from the peak concentration depth to the junction depth of the first impurity diffusion region.

Accordingly, the bottom of the first impurity diffusion region forms a junction of the low-concentrated first impurity diffusion region and the well region of the reversed conductivity type, which results in extending the depletion layer. Thus, the extension of the depletion layer is curbed only at the side portions of the junction portion in the first impurity diffusion region side. This arrangement makes it possible to suppress the short-channel effects while minimizing a rise in the junction leakage current and junction capacitance. As a result, it has become possible to provide a less-power-consuming transistor having a high driving force.

Moreover, it is preferable that the peak concentration of the fifth impurity diffusion region is lower than that of the first impurity diffusion region, that is, $1\times10^{18}$–$5\times10^{18}/cm^3{}_1$ and the peak concentration is located in the junction region, that is, on the side surface of the first impurity diffusion region in the gate electrode side.

Accordingly, the side portions of the junction portion of the first impurity diffusion region except for the bottom and those in the gate electrode side form a junction of the low-concentrated first impurity diffusion region and the well region of the reversed conductivity type, which results in extending the depletion layer. Thus, the extension of the depletion layer is curbed only in the region affected by the short-channel effects. This arrangement makes it possible to suppress the short-channel effects while minimizing an increase in the junction leakage current and junction capacitance. As a result, it has become possible to provide a less-power-consuming transistor having a high driving force.

Also, as has been explained in the first embodiment, it is preferable that the thickness of the sidewall dielectric film in a direction parallel to the main surface of the Si-substrate is 0.7–1.5 times, more preferably 1.0–1.5 times, of the junction depth of the first impurity diffusion region. According to this arrangement, the second impurity diffusion region is not covered by the horizontally extended first impurity diffusion region, and therefore, can operate effectively. Thus, the short-channel effects of the semiconductor device can be further suppressed. As a result, it has become possible to provide a less-power-consuming transistor having a high driving force.

Incidentally, it is known that silicidating the n-type semiconductor (silicon doped with arsenic through the ion implantation) is extremely difficult compared with the p-type semiconductor (silicon doped with boron through the ion implantation). To be more specific, in case of the n-type semiconductor, the silicidation reaction is interfered with and the sheet resistivity increases while the heat resistance deteriorates, which are not observed in the p-type semiconductor. It remains unclear why there is such a difference in silicidation between the n-type semiconductor and p-type semiconductor.

The inventors of the present invention have performed research in the hope to find out the reason why silicidating the n-type semiconductor is so difficult compared with the p-type semiconductor, and found that atoms causing these problems (increase in sheet resistivity and decrease in heat resistance) during the silicidation reaction are mainly oxygen and carbon atoms, followed by fluorine, arsenic, nitrogen, and boron atoms; although the influence of boron atoms is almost negligible.

Thus, to realize the titanium silicidation reaction in a satisfactory manner in the n-type semiconductor, it is preferable to remove most of oxygen and let a 3-element (Ti—Si—impurity) reaction take place. Note that, however, since the impurity per se interferes with the silicidation reaction, the result is improved compared with a case where oxygen and silicon intermix, but still, similar problems are highly likely. Such problems become apparent when fluorine serving as the impurity diffuses through silicon when implanting $BF_2$; the problems are obvious in order of fluorine, arsenic, and boron.

Also, to realize an ideal titanium silicidation reaction, the inventors found that it is most preferable to let a 2-element (titanium and silicon) reaction take place. This means most of the impurities (excluding nitrogen and boron) must be removed.

A semiconductor device such that satisfies the above conditions is fabricated by the process explained in the second embodiment, that is, a process of fabricating a semiconductor device, wherein the impurities which will form the source and drain regions are doped through the ion implantation into the Si-substrate using the polysilicon gate electrode formed on the Si-substrate as a mask, comprising the steps of:

(a) forming a gate electrode on the Si-substrate;

(b) introducing a second impurity which will form a second impurity diffusion region into the Si-substrate through the ion implantation;

(c) forming a sidewall dielectric film on the gate electrode sidewall;

(d) introducing a first impurity which will form a first impurity diffusion region into the Si-substrate through the ion implantation;

(e) forming a high-melting-point metal silicide film on the gate electrode and the surface of the Si-substrate in the two opposing sides of the sidewall dielectric film; and (f) introducing a third impurity which will form a third impurity diffusion region into the Si-substrate through the ion implantation;

According to the above fabrication sequence, the second impurity and first impurity are introduced into the Si-substrate before and after the sidewall dielectric films are formed, respectively. Further, the third impurity is introduced into the Si-substrate after the high-melting-point metal silicide film is formed. Therefore, it has become possible to reduce the concentration of the impurity that interferes with the silicidation reaction to the lowest level before the reaction takes place. Particularly, in case the impurity is arsenic, $10^{20}$ atoms/cm$^2$ or more of arsenic interferes with the silicidation reaction considerably. However, the above fabrication sequence can make the first and second impurity diffusion regions having quite low concentration, namely, less than $10^{20}$ atoms/cm$^2$. Thus, it has become possible to produce a silicide films of low resistance with excellent heat resistance. Also, since the third impurity is introduced after the silicidation reaction, a high-concentrated impurity diffusion region can be made without interfering with the silicidation reaction. Therefore, this arrangement can realize a low-resistance connection between the high-melting-point metal silicide film and the second impurity diffusion region. As a result, it has become possible to reduce the parasitic capacity at the ends of the source and drain of the transistor.

The above fabrication process preferably further comprises the step of forming a fifth impurity diffusion region by a tilted ion implantation after the sidewall dielectric film is formed on the gate electrode sidewall.

The fifth impurity diffusion region can be formed restrictively at the region affected by the short-channel effects in the junction portion of the first impurity diffusion region, that is, the end portion of the first impurity diffusion region in the channel side. As a result, it has become possible to suppress the short-channel effects while minimizing a rise in the junction leakage current and junction capacitance.

Further, as has been explained in the second embodiment, the semiconductor device fabricating process further comprises the step of forming a silicon nitride film without forming a natural oxide film on the surface of the Si-substrate before the (b) step above.

Including this step makes it possible to dope the impurity by the ion implantation not through the oxide film but the silicon nitride film. Thus, when the impurity is doped through the ion implantation, nitrogen atoms penetrate into the gate polysilicon film and Si-substrate instead of oxygen atoms, which conventionally penetrate into the same.

Thus, a titanium nitride film is readily formed in the grain boundary of the resulting titanium silicide film even when there exist a slight amount of oxygen components. When titanium nitride exists in the grain boundary instead of oxides, the surface free energy of the grain boundary between titanium nitride and TiSi$_2$ is small compared with that of the grain boundary between the oxides and TiSi$_2$. Therefore, when heated, the titanium film reduces migration and hardly agglomerates. Thus, including the above step makes it possible to produce a titanium silicide film with excellent heat resistance. As a result, the Si-substrate can be applied to the thermal annealing without degrading the quality of the silicide film after the same is formed.

Further, nitrogen atoms restore the crystalline defect in the Si-substrate caused by the impurity ion implantation. Thus, it has become possible to reduce the junction leakage current caused by such crystalline defect. To be more specific, in the conventional silicidation, titanium atoms are trapped into the crystalline defect as they are diffusing through the Si-substrate, and once trapped, the titanium atoms serve as the leak center and increases the junction leakage current. However, according to the above process, the crystalline defect can be restored by nitrogen atoms so that no titanium ions will be trapped. As a result, the junction leakage current can be further reduced when the junction is made through silicidation reaction.

Also, as previously mentioned, oxygen that interferes with the silicidation reaction readily penetrates into the n-type Si-substrate through the oxide film compared with the p-type Si-substrate. However, an amount of oxygen penetrates into the n-type Si-substrate during the impurity introduction can be reduced as low as the level of the p-type Si-substrate, because the impurity is introduced into the Si-substrate through the silicon nitride film. This arrangement makes it possible to form the p-type and n-type silicide films of the same thickness, thereby making the sheet resistance of the two films equal.

Further, since the resulting silicide film has a uniform thickness and renders excellent heat resistance, when the junction is formed through silicidation, diffusion of titanium metal to the junction region can be inhibited. As a result, it has become possible to provide a less-power-consuming transistor having a high driving force and capable of reducing the junction leakage current further.

Note that titanium is used as an example highmelting-point metal subject to silicidation reaction. However, other high-melting-point metals, such as cobalt and nickel, can be used as well. In particular, cobalt induces great effects as it is readily influenced by oxygen. The same effects can be realized when hafnium, zirconium, vanadium, molybdenum, platinum, etc. are silicidated instead of titanium.

It is preferable that the above semiconductor device fabricating process further comprises a thermal annealing step before the (e) step above, so that the impurity ions contained in the Si-substrate are activated to form the impurity diffusion regions.

According to this arrangement, the step of activating the first and second impurities is placed before forming the high-melting-point metal silicide film. Thus, the impurities can be fully activated and the crystalline defect caused by the ion implantation can be restored without being limited by the heat resistance of the silicide film. Consequently, titanium will not be trapped into the crystalline defect mainly because the nitrogen atoms restore the crystalline defect, thereby making it possible to reduce the junction leakage current.

Further, it is preferable that, in the process of fabricating a semiconductor device of the third embodiment, the high-melting-point metal silicide film used in the (e) step is a titanium silicide film, and the step (e) includes the sub-steps below to form the high-melting-point metal silicide film on the gate electrode and the surface of the Si-substrate in the two opposing sides of the sidewall dielectric film:

(e-1) exposing the surface of the Si-substrate and gate electrode using the sidewall dielectric films as a mask;

(e-2) depositing a titanium film on the Si-substrate entirely; and (e-3) forming a metastable stoichiometric titanium silicide film by reacting the surface of the Si-substrate and the titanium film through the RTA in an inert gas atmosphere including nitrogen atoms, such as nitrogen or ammonia atmosphere, Also, it is preferable that the semiconductor device fabricating process further includes the steps of:

(f) introducing a third impurity on the Si-substrate through the titanium nitride film formed on the silicide film as a result of the silicidation reaction in the (e-3) sub-step;

(g) removing the unreacted titanium film and the titanium nitride film; and (h) converting the titanium silicide film into the one having a stable stoichiometric TiSi$_2$ C54 crystal structure through the thermal annealing.

According to this step sequence arrangement, the (h) step of thermal annealing is placed before the (f) step introducing the third impurity. Thus, the thermal annealing in the (h) step can also activate the third impurity, thereby making it possible to simplify the semiconductor device fabricating process.

It is preferable that the (a) step of forming the polysilicon gate electrode in the above semiconductor device fabricating process includes the sub-steps of:

(a-1) forming a gate oxide film on the Si-substrate;

(a-2) depositing a polysilicon film on the gate oxide film;

(a-3) depositing a silicon nitride film on the polysilicon film; and (a-4) patterning the polysilicon film and silicon nitride film.

In the conventional fabricating process, oxygen penetrates far deep into the polysilicon film along the crystal grain boundary from the surface during the steps of, for example, releasing the wafer to air, cleaning the wafer, and coating the wafer with a photoresist. However, by including the above four sub-step (a-1) through (a-4), the silicon nitride film on the polysilicon film serves as a barrier during the above-mentioned steps. Therefore, oxygen does not penetrate into the Si-substrate and most of O (oxygen) components can be removed before the silicidation reaction takes place later. Accordingly, a silicide film with excellent heat resistance such that does not agglomerate even it is made into a 0.25 $\mu$m-wide line can be formed. As a result, it has become possible to enable the silicide film to maintain excellent heat resistance and smaller sheet resistivity.

Further, as was explained in the fabricating process of the second embodiment, it is preferable that the Si-substrate is transported without being open to air in a oxygen-free state between the sub-steps of (a-1) and (a-2) and the sub-steps of (a-2) and (a-3). According to this arrangement, the wafer is not open to air before and after the gate oxide film is formed and after the polysilicon film is deposited. As a result, it has become possible to remove most of the oxygen components that otherwise penetrate into the polysilicon film, and therefore, provide a silicide film of low resistance with excellent heat resistance.

In addition, it is preferable that, in the sub-step (a-4) of patterning, the silicon nitride film is etched into a specific pattern using the photoresist pattern formed on the silicon nitride film as a mask, and after the photoresist is removed, the polysilicon film is etched into a specific pattern using the resulting patterned silicon nitride film as a mask.

According to this step sequence arrangement, the nitride film forming the ground serves as an anti-reflection film, thereby improving the shape of the photoresist mask in the lower end drastically. In addition, the nitride film mask is so thin that there will be substantially no error in finished dimensions before and after forming the mask. Further, since the gate electrode is etched into the polysilicon film using the nitride film mask after the resist mask is removed, the impurities contained in the resist do not cause any adverse effect during the etching, thereby making it possible to increase the selectivity of the etching rate with respect to the gate oxide film by a factor of 2 or greater. Also, since the deposition of a reaction product during the etching is reduced compared with the conventional case using the resist mask, the compression dependency is eliminated. In addition, the polysilicon film that will form the gate electrode is etched before the impurity is doped. Thus, compared with a conventional n$^+$-doped material, the polysilicon film renders higher electric resistance. Hence, the polysilicon film is hardly affected by the charges, and the gate dielectric film is hardly damaged while there occurs less side etching (notching) in the lower end of the gate electrode. As a result, it has become possible to (a) produce a transistor as precise as design dimensions, (2) eliminate damages to the Si-substrate, and (d) reduce the junction leakage current.

Further, it is preferable that the silicon nitride film is 10–30 nm thick and the polysilicon film is 50–150 nm thick.

According to this arrangement, the silicon nitride film is so thin that the same can be processed without causing any measurement shift with respect to the photoresist. In addition, since the polysilicon film is relatively thin, the same can be processed into the gate electrode in a well controlled manner. That is to say, when etching the silicon nitride film into the gate electrode, an amount of over-etching can be reduced due to the thinness of the film, thereby making it possible to reduce the damage to the surface of the Si-substrate. Further, although the impurity is doped into the gate through ion implantation, the thinness of the film can prevent the depletion in the gate electrode. As a result, it has become possible to form a transistor gate electrode as precise as the design dimension.

Also, as has been explained, the process of producing a CMOS device of the third embodiment, wherein p-type and n-type wells are formed on the surface layer of the Si-substrate, and the impurities, which will form the source and drain regions in each well, are doped through the ion implantation using the gate oxide film and polysilicon gate electrode formed on these wells as masks, comprises the steps of:

(1) forming a gate electrode in each well on the Si-substrate surface layer;

(2) introducing a second impurity, which will form an n-type second impurity diffusion region in the p-type well and a p-type second impurity diffusion region in the n-type well;

(3) forming sidewall dielectric films on the gate electrode sidewalls in the p-type and n-type wells;

(4) introducing a first impurity, which will form an n-type first impurity diffusion region in the p-type well and a p-type second impurity diffusion region in the n-type well;

(5) forming high-melting-point metal silicide films on the gate electrode and the Si-substrate on the surface in the two opposing sides of the sidewall dielectric films; and (6) introducing a third impurity, which will form an n-type third impurity diffusion region in the p-type well and a p-type third impurity diffusion region in the n-type well.

Like the steps (a) through (f) above, this step sequence arrangement makes it possible to maintain low-resistance connection between the high-melting-point metal silicide films and the second impurity diffusion region in each of the p-type and n-type wells. Since the thermal annealing conditions to activate impurity can be set separately in the n-channel and p-channel, the n-channel and p-channel can be designed separately to some extent. As a result, it has become possible to produce a CMOS device capable of suppressing the short-channel effects and reducing the junction leakage current.

Incidentally, in case of the p-channel transistor, boron introduced through the ion implantation to serve as the acceptor impurity may react with titanium atoms during the titanium silicidation reaction to form $TiB_2$. This drastically reduces the concentration of the acceptor, which otherwise will serve as the p-type carrier, thereby making it impossible to maintain the low-resistant ohmic contact between $TiSi_2$ and the impurity diffusion regions. Thus, the transistor parasitic serial resistivity increases considerably, even though the silicide film renders low resistance. To solve this problem, the step (6) is placed after the step (5), so that the third impurity is introduced after the silicidation reaction. As a result, it has become possible to eliminate the above problem and produce a CMOS device having a small transistor parasitic serial resistivity.

It is preferable that the step (4) includes the sub-steps of:
(4-1) introducing the n-type first impurity into the p-type well on the Si-substrate;
(4-2) heating the first and second impurities of n-type introduced in the p-type well, and the p-type second impurity introduced into the n-type well to activate these three impurities; and
(4-3) introducing the p-type first impurity into the n-type well on the Si-substrate.

Since the sub-step (4-2) is placed between the sub-steps of (4-1) and (4-3), the annealing conditions can be set separately to activate the first impurity in the p-type well and the first impurity in the n-type well. In contrast, when the p-type well and n-type well are annealed at the same time like in the conventional process, it is difficult to fabricate a CMOS transistor having a p-type transistor capable of suppressing the short-channel effects and an n-type transistor capable of reducing the junction leakage current. To be more specific, if the conditions of the simultaneous annealing are optimized to activate arsenic, boron diffuses faster than desired, thereby disabling the p-type transistor to suppress the short-channel effects. On the other hand, if the conditions of the simultaneous annealing are optimized to activate boron, the damage caused by the arsenic implant is not restored completely, thereby deteriorating the junction leak characteristics. However, setting the annealing conditions separately makes it possible to fabricate a CMOS transistor having a p-type transistor capable of suppressing the short-channel effects and an n-type transistor capable of reducing the junction leakage current.

Further, it is preferable that the step (4) above includes another sub-step of heating the p-type first impurity introduced into the n-type well to activate the same after the sub-step (4-3).

According to this step sequence arrangement, the p-type first impurity introduced into the n-type well on the Si-substrate is heated and activated before the high-melting-point metal silicide films are formed through a thermal annealing. Thus, the thermal annealing to activate the p-type first impurity and the RTA to form the silicide film are performed separately, so that the former can be performed in the furnace. As a result, the junction leakage current can be reduced, and it has become possible to fabricate a less-power-consuming p-type transistor.

The CMOS device fabricating process of the third embodiment further includes the step of heating the n-type third impurity introduced into the p-type well and the p-type third impurity introduced into the n-type well to activate these impurities after the step (6) above.

According to this step sequence arrangement, the n-type third impurity introduced into the p-type well and the p-type third impurity introduced into the n-type well are heated and activated after the high-melting-point metal silicide films are formed through the RTA. Thus, the thermal annealing to activate the third impurities and a RTA to form the silicide film are performed separately, so that the former can be performed in the furnace. When the impurities are activated during the RTA in the step of forming the silicide film like in the conventional process, the depletion of the gate electrode may not be prevented sufficiently depending on the temperature or implantation energy setting. However, in the present fabricating process, the depletion of the gate electrode can be prevented in a secure manner. Thus, it has become possible to fabricate a transistor having a high driving force.

As has been explained in the second embodiment, a semiconductor producing apparatus comprises a device for forming a gate oxide film on the Si-substrate, a device for depositing a polysilicon film on the gate oxide film, a device for depositing a silicon nitride film on the polysilicon film, all of which are connected to a nitrogen-purged chamber keeping a dew point at −100° C. or below. Therefore, the Si-substrate is hardly open to air during the transportation, that is, the wafer is transported in an oxygen-free state.

Thus, it has become possible to remove $H_2O$ molecules adhering onto the surface of the wafer through the nitrogen purge in the nitrogen-purged chamber keeping a dew point at −100° C. or below. Then, the wafer is transported in the following sequence: oxidation furnace (forming the gate oxide film), nitrogen-purged chamber, silicon depositing furnace (depositing the polysilicon gate electrode), nitrogen-purged chamber, and nitrogen silicon film depositing furnace (depositing the nitrogen silicon film). As a result, it has become possible to carry out the fabrication sequence starting with the gate oxidation step and ending with the nitrogen silicon film depositing step without permitting the passage of air.

Therefore, the gate oxide film formed by the above apparatus has no natural oxide film even before the gate oxidation step. This means that such a gate oxide film is hardly susceptible to contamination and includes fewer surface states, thereby rendering high reliability. Also, the surface of the gate polysilicon film is never exposed to air until the silicidation step, and when the wafer is open to air, the silicon nitride film formed on the surface of the polysilicon film serves as a barrier. Thus, oxygen will not penetrate far deep into the polysilicon film along the crystal grain boundary from the surface. As a result, it has become possible to form a gate oxidation film and polysilicon film rendering enhanced reliability compared with the conventional ones.

The invention being thus described, it will be obvious that the same may be varied in many ways. Such variations are not to be regarded as a departure from the spirit and scope of the invention, and all such modification as would be obvious to one skilled in the art are intended to be included within the scope of the following claims.

What is claimed is:

1. A semiconductor device comprising:
   a polysilicon gate electrode formed on a silicon semiconductor substrate through a gate oxide film;
   a sidewall dielectric film formed on a sidewall of said gate electrode;
   a high-melting-point metal silicide film formed on said gate electrode and over said silicon semiconductor substrate outside of said sidewall dielectric films;
   a channel region formed on the surface of said silicon semiconductor substrate below said gate oxide film beneath said gate electrode,
   a source region and a drain region formed respectively in said silicon semiconductor substrate in two opposing sides of said gate electrode in such a manner to sandwich said channel region, said source region and said drain region each including a first impurity diffusion region, a second impurity diffusion region, and a third impurity diffusion region, said first impurity diffusion region being offset from said channel region, said second impurity diffusion region touching said channel region, being shallower than said first impurity diffusion region and having a higher impurity concentration than said first impurity diffusion region, said third impurity diffusion region being formed in said first impurity diffusion region, said third impurity diffusion region touching said second impurity diffusion region at a side surface of said channel region and at least a bottom surface of said metal silicide film, said third impurity diffusion region being shallower than said first impurity diffusion region and having a higher impurity concentration than said first and second impurity diffusion regions.

2. The semiconductor device as defined in claim 1 further comprising a fourth impurity diffusion region provided in said silicon semiconductor substrate below said gate electrode, said fourth impurity diffusion region being formed in a region touching said first impurity diffusion region, said fourth impurity diffusion region and said first impurity diffusion region having their respective conductivity types, wherein said first impurity diffusion region touches said fourth impurity diffusion region at a side surface while touching a well region of said silicon semiconductor substrate at a bottom surface.

3. The semiconductor device as defined in claim 2 further comprising a fifth impurity diffusion region, said fifth impurity diffusion region being formed in a region where said first and fourth impurity diffusion regions touch each other, said fifth impurity diffusion region and said first impurity diffusion region having their respective conductivity types.

4. The semiconductor device as defined in claim 1, wherein:

said first impurity diffusion region has a concentration of $1 \times 10^{17}$ or higher and a junction depth of 50–300 nm;

said second impurity diffusion region has a concentration of $5 \times 10^{18}$–$5 \times 10^{19}$/cm$^3$ and a junction depth of 5–70 nm; and said third impurity diffusion region has a peak concentration of $5 \times 10^{19}$/cm$^3$ or higher and a peak concentration depth of 5–70 nm.

5. The semiconductor device as defined in claim 2, wherein said fourth impurity diffusion region has a peak concentration of $1 \times 10^{17}$–$5 \times 10^{18}$/cm$^3$ which is lower than a peak concentration of said first impurity diffusion region, and a depth of the peak concentration is set in a range from the peak concentration and a junction depth of said first impurity diffusion region.

6. The semiconductor device as defined in claim 3, wherein said fifth impurity diffusion region has a peak concentration of $1 \times 10^{17}$–$5 \times 10^{18}$/cm$^3$ which is lower than a peak concentration of said first impurity diffusion region, and a depth of the peak concentration is in a junction region located on a side surface of said first impurity diffusion region in a gate electrode side.

7. The semiconductor device as defined in claim 1, wherein a thickness of said sidewall dielectric film in a direction parallel to a main surface of said silicon semiconductor substrate is set to 0.7–1.5 times a junction depth of said first impurity diffusion region.

8. The semiconductor device as claimed in claim 1, wherein the thickness of said sidewall dielectric film in a direction parallel to a main surface of said silicon semiconductor substrate is set to 1.0–1.5 times a junction depth of said first impurity diffusion region.

9. The semiconductor device as defined in claim 1, wherein said high-melting-point metal silicide film is a titanium silicide film.

10. The semiconductor device as defined in claim 1, wherein;

said first impurity diffusion region has a concentration of $5 \times 10^{17}$–$5 \times 10^{18}$/cm$^3$ and a junction depth of 50–300 nm;

said second impurity diffusion region has a concentration of $1 \times 10^{19}$–$5 \times 10^{19}$/cm$^3$ and a junction depth of 5–70 nm; and said third impurity diffusion region has a peak concentration of $5 \times 10^{19}$/cm$^3$ or higher and a peak concentration depth of 5–70 nm.

* * * * *

UNITED STATES PATENT AND TRADEMARK OFFICE
CERTIFICATE OF CORRECTION

PATENT NO. : 5,880,500

DATED : March 9, 1999

INVENTOR(S) : Hiroshi IWATA, Masayuki NAKANO, Seizo KAKIMOTO

It is certified that errors appear in the above-identified patent and that said Letters Patent is hereby corrected as shown below:

In column 13, line 8, "AS" should read --As--.

In column 13, line 56, "pcS/cm$^3$" should read --pcs/cm$^3$--.

In column 29, claim 4, line 41, "1x10$^{17}$" should read --1x10$^{17}$/cm$^3$--.

In column 30, claim 10, line 32, "wherein;" should read --wherein:--.

Signed and Sealed this

Twenty-fifth Day of January, 2000

Attest:

Attesting Officer

Acting Commissioner of Patents and Trademarks